US009418881B2

(12) United States Patent
Sugiura et al.

(10) Patent No.: US 9,418,881 B2
(45) Date of Patent: Aug. 16, 2016

(54) SUBSTRATE PROCESSING APPARATUS CAPABLE OF SWITCHING CONTROL MODE OF HEATER

(75) Inventors: Shinobu Sugiura, Toyama (JP); Masaaki Ueno, Toyama (JP); Kazuo Tanaka, Toyama (JP); Masashi Sugishita, Toyama (JP); Hideto Yamaguchi, Toyama (JP); Kenji Shirako, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 925 days.

(21) Appl. No.: 13/192,784

(22) Filed: Jul. 28, 2011

(65) Prior Publication Data
US 2012/0094010 A1    Apr. 19, 2012

(30) Foreign Application Priority Data

Oct. 18, 2010   (JP) .................................. 2010-233575
May 11, 2011   (JP) .................................. 2011-106088

(51) Int. Cl.
*H01L 21/67*    (2006.01)
*G05D 23/19*    (2006.01)
(Continued)

(52) U.S. Cl.
CPC ........ *H01L 21/67248* (2013.01); *C23C 14/541* (2013.01); *C23C 16/52* (2013.01);
(Continued)

(58) Field of Classification Search
CPC ....... G05D 23/00; G05D 23/19; G05D 23/20; G05D 23/22; G05D 23/2224; G05D 23/2226; G05D 23/2228; H01L 21/67248; H01L 21/67098; H01L 21/67109
USPC .................. 118/708, 715; 156/345.1, 345.24, 156/345.27, 345.28, 345.52
See application file for complete search history.

(56) References Cited

U.S. PATENT DOCUMENTS 4,913,790 A * 4/1990 Narita et al. ............... 427/248.1
5,831,249 A * 11/1998 Rohner et al. ................ 219/413
(Continued)

FOREIGN PATENT DOCUMENTS

JP    2004-119804 A    4/2004
JP    2004119804 A * 4/2004 ............. H01L 21/22
(Continued)

OTHER PUBLICATIONS

Yamari Industries, Limited. Publication No. 1255. (2004). Osaka, Japan. pp. 1-54. Available online Aug. 11, 2014 at http://www.yamari.co.jp/english/pdf/yamari_thermo_0411.pdf.*

*Primary Examiner* — Rakesh Dhingra
*Assistant Examiner* — Stanislav Antolin
(74) *Attorney, Agent, or Firm* — Volpe and Koenig, P.C.

(57) ABSTRACT

Provided is a substrate processing apparatus capable of suppressing inferiority when heat treatment is controlled using a temperature sensor. The substrate processing apparatus includes a heating means configured to heat a process chamber wherein a substrate is accommodated; a first temperature detection means configured to detect a temperature about the substrate using a first thermocouple; a second temperature detection means configured to detect a temperature about the heating means using a second thermocouple; a control unit configured to control the heating means based on the temperature detected by the first temperature detection means and the temperature detected by the second temperature detection means; and a control switching means configured to control the control unit based on the temperatures detected by the first temperature detection means and the second temperature detection means such that the control unit is switched between a first control mode and a second control mode, wherein a heat resistance of the first thermocouple is greater than that of the second thermocouple, and a temperature detection performance of the second thermocouple is higher than that of the first thermocouple.

6 Claims, 17 Drawing Sheets

(51) Int. Cl.
  *G05D 23/20*    (2006.01)
  *C23C 14/54*    (2006.01)
  *C23C 16/458*   (2006.01)
  *C23C 16/52*    (2006.01)
  *G05D 23/22*    (2006.01)

(52) U.S. Cl.
  CPC ............ G05D23/1931 (2013.01); G05D 23/22 (2013.01); H01L 21/67109 (2013.01); *C23C 16/4584* (2013.01)

(56) References Cited

U.S. PATENT DOCUMENTS

| | | | |
|---|---|---|---|
| 5,875,416 A * | 2/1999 | Kanno | 702/130 |
| 5,895,596 A * | 4/1999 | Stoddard et al. | 219/497 |
| 6,063,234 A * | 5/2000 | Chen et al. | 156/345.27 |
| 6,211,495 B1 * | 4/2001 | Stoddard et al. | 219/497 |
| 6,229,116 B1 * | 5/2001 | Shirakawa et al. | 219/390 |
| 6,262,397 B1 * | 7/2001 | Yazawa | 118/724 |
| 6,496,749 B1 * | 12/2002 | Yamaguchi et al. | 700/121 |
| 2002/0045146 A1 * | 4/2002 | Wang et al. | 432/49 |
| 2002/0055080 A1 * | 5/2002 | Tanaka et al. | 432/49 |
| 2003/0203517 A1 * | 10/2003 | Suzuki et al. | 438/14 |
| 2004/0087185 A1 * | 5/2004 | Ejima | 438/795 |
| 2004/0211660 A1 * | 10/2004 | Mitrovic et al. | 204/164 |
| 2008/0046110 A1 * | 2/2008 | Sugishita et al. | 700/207 |
| 2008/0182345 A1 * | 7/2008 | Sugishita et al. | 438/7 |
| 2009/0095422 A1 * | 4/2009 | Sugishita et al. | 118/708 |
| 2009/0107978 A1 * | 4/2009 | Sugishita et al. | 219/385 |
| 2010/0124726 A1 * | 5/2010 | Sugishita et al. | 432/36 |

FOREIGN PATENT DOCUMENTS

| | | |
|---|---|---|
| JP | 2006-284155 A | 10/2006 |
| JP | 2007-049078 A | 2/2007 |

* cited by examiner

FIG. 14

| CURRENT CONTROL | MEASUREMENT VALUE | | SWITCHING OF TEMPERATURE CONTROL |
|---|---|---|---|
| | LOW-TEMPERATURE RADIATION THERMOMETER | HIGH-TEMPERATURE RADIATION THERMOMETER | |
| CONTROL ACCORDING TO LOW-TEMPERATURE RADIATION THERMOMETER | THRESHOLD P OR HIGHER | LESS THAN THRESHOLD P | SWITCHED TO HIGH-TEMPERATURE RADIATION THERMOMETER |
| | THRESHOLD P OR HIGHER | THRESHOLD P OR HIGHER | SWITCHED TO HIGH-TEMPERATURE RADIATION THERMOMETER |
| | LESS THAN THRESHOLD P | THRESHOLD P OR HIGHER | CONTINUE LOW-TEMPERATURE RADIATION THERMOMETER |
| | LESS THAN THRESHOLD P | LESS THAN THRESHOLD P | CONTINUE LOW-TEMPERATURE RADIATION THERMOMETER |
| CONTROL ACCORDING TO HIGH-TEMPERATURE RADIATION THERMOMETER | THRESHOLD M OR HIGHER | LESS THAN THRESHOLD M | SWITCHED TO LOW-TEMPERATURE RADIATION THERMOMETER |
| | THRESHOLD M OR HIGHER | THRESHOLD M OR HIGHER | CONTINUE HIGH-TEMPERATURE RADIATION THERMOMETER |
| | LESS THAN THRESHOLD M | THRESHOLD M OR HIGHER | CONTINUE HIGH-TEMPERATURE RADIATION THERMOMETER |
| | LESS THAN THRESHOLD M | LESS THAN THRESHOLD M | SWITCHED TO LOW-TEMPERATURE RADIATION THERMOMETER |

FIG. 16

| CURRENT CONTROL | MEASUREMENT VALUE | | SWITCHING OF TEMPERATURE CONTROL |
|---|---|---|---|
| | LOW-TEMPERATURE RADIATION THERMOMETER | HIGH-TEMPERATURE RADIATION THERMOMETER | |
| CONTROL ACCORDING TO LOW-TEMPERATURE RADIATION THERMOMETER | THRESHOLD P OR HIGHER | THRESHOLD M OR HIGHER | SWITCHED TO HIGH-TEMPERATURE RADIATION THERMOMETER |
| | THRESHOLD P OR HIGHER | LESS THAN THRESHOLD M | CONTINUE LOW-TEMPERATURE RADIATION THERMOMETER |
| | LESS THAN THRESHOLD P | THRESHOLD M OR HIGHER | CONTINUE LOW-TEMPERATURE RADIATION THERMOMETER |
| | LESS THAN THRESHOLD P | LESS THAN THRESHOLD M | CONTINUE LOW-TEMPERATURE RADIATION THERMOMETER |
| CONTROL ACCORDING TO HIGH-TEMPERATURE RADIATION THERMOMETER | THRESHOLD P OR HIGHER | THRESHOLD M OR HIGHER | CONTINUE HIGH-TEMPERATURE RADIATION THERMOMETER |
| | LESS THAN THRESHOLD P | THRESHOLD M OR HIGHER | CONTINUE HIGH-TEMPERATURE RADIATION THERMOMETER |
| | THRESHOLD P OR HIGHER | LESS THAN THRESHOLD M | SWITCHED TO LOW-TEMPERATURE RADIATION THERMOMETER |
| | LESS THAN THRESHOLD P | LESS THAN THRESHOLD M | SWITCHED TO LOW-TEMPERATURE RADIATION THERMOMETER |

SUBSTRATE PROCESSING APPARATUS CAPABLE OF SWITCHING CONTROL MODE OF HEATER

CROSS-REFERENCE TO RELATED PATENT APPLICATION

This U.S. non-provisional patent application claims priority under 35 U.S.C. §119 of Japanese Patent Application No. 2010-233575, filed on Oct. 18, 2010, and No. 2011-106088, filed on May 11, 2011, in the Japanese Patent Office, the entire contents of which are hereby incorporated by reference.

BACKGROUND OF THE INVENTION

1. Field of the Invention

The present invention relates to a substrate processing apparatus for performing a desired heat treatment through a diffusion process or a chemical vapor deposition (CVD) process.

2. Description of the Related Art

A vertical thermal diffusion apparatus or a vertical decompression CVD apparatus is configured, for example, to receive a substrate in a heat treatment furnace to form a thin film on a processing substrate, heat an interior of the heat treatment furnace using a predetermined heating means, and in most cases, detect a temperature in the heat treatment furnace using a temperature sensor installed at the heat treatment furnace, and control the temperature based on the result.

For example, Patent Document 1 discloses a semiconductor manufacturing apparatus for controlling a temperature through feedback control, which is always stable even when disturbance accompanied by rapid cooling occurs. The semiconductor manufacturing apparatus performs temperature control by a cascade control loop using a thermocouple (a heater thermocouple) installed around a heater for heating the interior of a heat treatment furnace and a thermocouple (a cascade thermocouple) installed between a heat distribution tube and a reaction tube in the heat treatment furnace when a temperature elevation process is performed or a target temperature is maintained, and performs temperature control by directly switching a control loop using only the cascade thermocouple when a heater temperature is lowered.

RELATED ART DOCUMENT

Patent Document 1

1. Japanese Unexamined Patent Application Publication No. 2004-119804

For example, in a conventional art, a temperature sensor configured to detect a temperature in a heat treatment furnace of a vertical thermal diffusion apparatus generally uses an R-type thermocouple. However, when the R-type thermocouple is used in the vertical thermal diffusion apparatus, in particular, in which a process temperature is high (1000° C. or higher), the thermocouple may be disconnected early on. The thermocouple may be expected to be deformed by generation of a difference in elongation at a high temperature due to a difference in thermal expansion between a positive (+) side wire and a negative (−) side wire of the thermocouple, and temperature elevation and temperature drop are repeated to repeat deformation, causing deterioration and disconnection of the wire. In addition, as a separate cause, a thermocouple crystal becomes bulky due to use at a high temperature and interfaces of grains become weak in strength, causing disconnection of the wire.

In addition, a B-type thermocouple having a better heat resistance than the R-type thermocouple has problems such as small thermo-electromotive force and difficulty in measurement at a low temperature.

Here, the R-type thermocouple and the B-type thermocouple are referred to as thermocouples defined in JIS C1602. More specifically, the R-type thermocouple is a thermocouple using a platinum-rhodium alloy containing 13% rhodium as a material constituting a positive (+) leg and platinum as a material constituting a negative (−) leg. In addition, the B-type thermocouple is a thermocouple using a platinum-rhodium alloy containing 30% rhodium as a material constituting a positive (+) leg and a platinum-rhodium alloy containing 6% rhodium as a material constituting a negative (−) leg.

Further, for example, when a temperature in the heat treatment furnace is detected using a radiation thermometer, since the radiation thermometer measures a temperature of a subject using a wavelength, a detectable temperature range is limited. As a result, in order to measure a wide range of temperature, several kinds of radiation thermometers such as a low-temperature radiation thermometer, a high-temperature radiation thermometer, and so on, are needed. However, when the several kinds of radiation thermometers are switched and controlled according to a temperature range, a temperature value measured upon switching and a temperature value measured around the switching temperature may become unstable.

SUMMARY OF THE INVENTION

It is an object of the present invention to provide a substrate processing apparatus capable of suppressing inferiority when heat treatment is controlled using a temperature sensor.

In order to accomplish the above object, there is provided a substrate processing apparatus including: a heating means configured to heat a process chamber wherein a substrate is accommodated; a first temperature detection means configured to detect a temperature about the substrate using a first thermocouple; a second temperature detection means configured to detect a temperature about the heating means using a second thermocouple; a control unit configured to control the heating means based on the temperature detected by the first temperature detection means and the temperature detected by the second temperature detection means; and a control switching means configured to control the control unit based on the temperatures detected by the first temperature detection means and the second temperature detection means such that the control unit is switched between a first control mode and a second control mode, wherein a heat resistance of the first thermocouple is greater than that of the second thermocouple, and a temperature detection performance of the second thermocouple is higher than that of the first thermocouple In addition, there is provided a temperature controlling method of a substrate processing apparatus, including: heating a process chamber wherein a substrate is accommodated using a heating means; detecting a temperature about the substrate by a first temperature detection means using a first thermocouple; detecting a temperature about the heating means by a second temperature detection means using a second thermocouple; and switching between a first control mode and a second control mode according to the temperature detected by the first temperature detection means or the second temperature detection means, wherein the heating means is controlled based on the temperatures detected by the first temperature detection means and the second temperature detection means in the first control mode, and the heating means is controlled based on the temperature detected by the second temperature detection means in the second control mode, wherein a heat resistance of the first thermocouple is greater than that of the second thermocouple, and a temperature detection performance of the second thermocouple is higher than that of the first thermocouple Further, there is provided a substrate processing apparatus including: a heating means configured to heat a process chamber wherein a substrate is accommodated; a first temperature detection means configured to detect a temperature inside the process chamber heated by the heating means using a first radiation thermometer; a second temperature detection means configured to detect a temperature inside the process chamber heated by the heating means using a second radiation thermometer, wherein an upper limit of a detectable temperature range of the second radiation thermometer is higher than an upper limit of a detectable temperature range of the first radiation thermometer and an lower limit of the detectable temperature range of the second radiation thermometer is higher than a lower limit of the detectable temperature range of the first radiation thermometer; a control unit configured to control the heating means based on the temperatures detected by the first temperature detection means and the second temperature detection means; and a control switching means configured to switch the control unit between a first control mode and a second control mode, wherein the control switching means switches the control unit between a first control mode and a second control mode based on the temperatures detected by the first temperature detection means and the second temperature detection means or based on one of the temperatures detected by the first temperature detection means and the second temperature detection means and a preset threshold Furthermore, there is provided a heating method of a substrate processing apparatus, including: heating a process chamber wherein a substrate is accommodated using a heating means; detecting a temperature inside the process chamber heated by the heating means by a first temperature detection means using a first radiation thermometer; detecting a temperature inside the process chamber heated by the heating means by a second temperature detection means using a second radiation thermometer, wherein an upper limit of a detectable temperature range of the second radiation thermometer is higher than an upper limit of a detectable temperature range of the first radiation thermometer and an lower limit of the detectable temperature range of the second radiation thermometer is higher than a lower limit of the detectable temperature range of the first radiation thermometer; and switching, based on the temperature detected by the first temperature detection means or the second temperature detection means and a predetermined threshold, a first control unit to control the heating means based on the temperature detected by the first temperature detection means and a second control unit to control the heating means based on the temperature detected by the second temperature detection means.

Effects of the Invention

According to the present invention, it is possible to provide a substrate processing apparatus capable of suppressing inferiority when heat treatment is controlled using a temperature sensor.

BRIEF DESCRIPTION OF THE DRAWINGS

FIG. 14 is a table showing a switching rule of temperature control by a temperature control unit 362;

FIG. 16 is a table showing a switching rule of temperature control by a temperature control unit 362 in accordance with a variation of the second embodiment of the present invention.

DETAILED DESCRIPTION OF THE PREFERRED EMBODIMENTS

Hereinafter, a first embodiment will be described with reference to the accompanying drawings.

Figure 1:
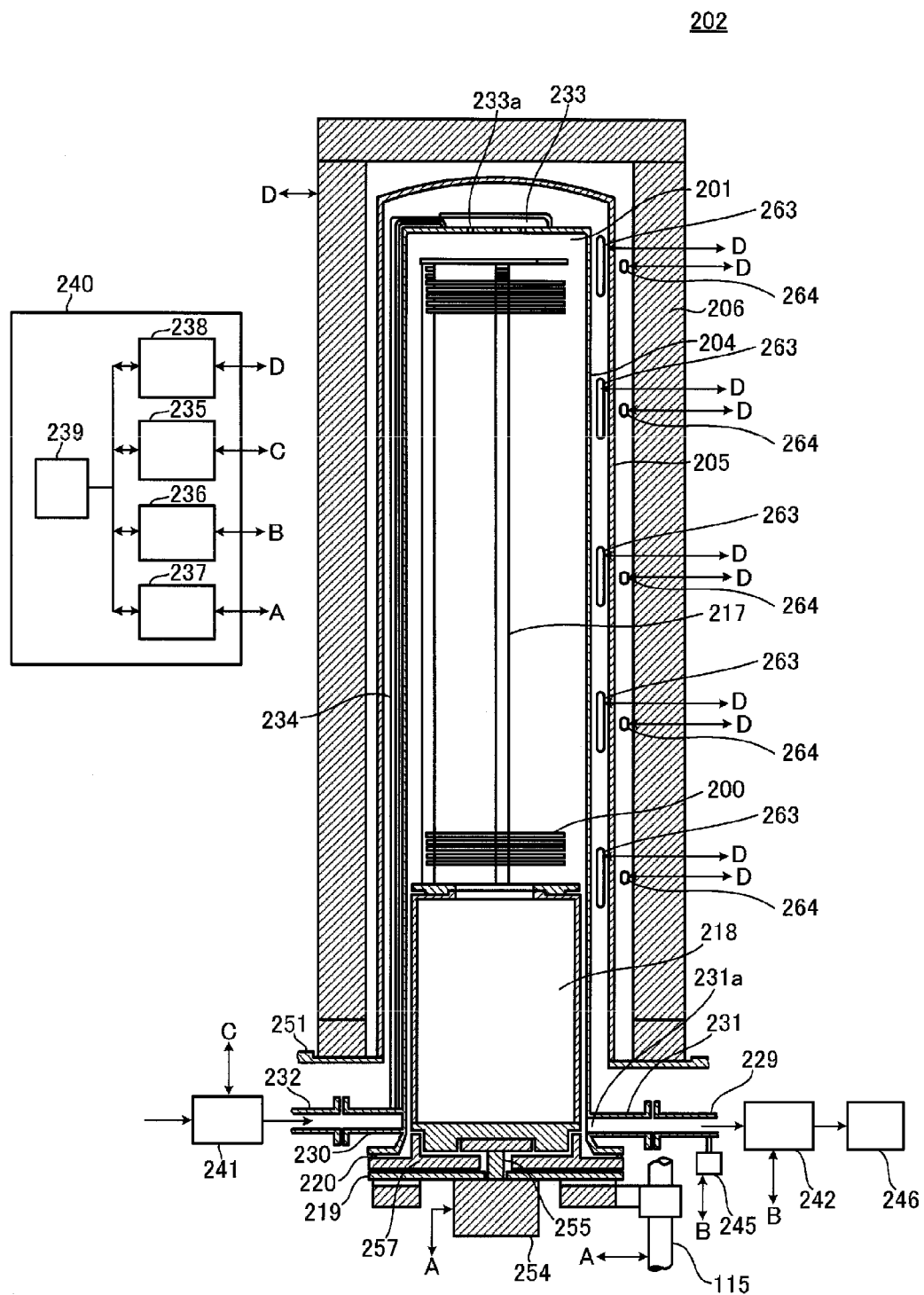
FIG. 1 is a cross-sectional view of a process furnace of a vertical thermal diffusion apparatus, which is a substrate processing apparatus in accordance with a first embodiment of the present invention.

FIG. 1 is a schematic view of a process furnace 202 of a vertical thermal diffusion apparatus, which is a substrate processing apparatus preferably used in the first embodiment of the present invention, shown as a vertical cross-sectional view.

As shown in FIG. 1, the process furnace 202 includes a heater 206, which is a heating mechanism. The heater 206 has a cylindrical shape, and is vertically installed and supported by a heater base 251, which functions as a holding plate.

A heat distribution tube (outer tube) 205 formed of a heat-resistance material such as SiC and having a cylindrical shape with an upper end closed and a lower end opened is, for example, disposed inside the heater 206 so as to be concentric with the heater 206. In addition, a reaction tube (inner tube) 204 formed of a heat-resistance material such as quartz ($SiO_2$) and having a cylindrical shape with an upper end closed and a lower end opened is, for example, disposed inside the heat distribution tube 205 so as to be concentric with the heat distribution tube 205. A process chamber 201 is formed in a cylindrical hollow part of the reaction tube 204, which is configured to accommodate wafers 200, which are substrates, in a state in which the wafers 200 are disposed in a horizontal posture by a boat 217 to be described later and vertically arranged in multiple stages.

A gas introduction unit 230 is installed at a lower end of the reaction tube 204, and a narrow tube 234, which is a gas introduction pipe, is additionally disposed at an outer wall of the reaction tube 204 from the gas introduction unit 230 to a ceiling unit 233 of the reaction tube 204. A gas introduced through the gas introduction unit 230 flows through the narrow tube 234 to arrive at the ceiling unit 233, and is introduced into the process chamber 201 through a plurality of gas introduction ports 233a installed at the ceiling unit 233. In addition, a gas exhaust unit 231 is installed at a position of the lower end of the reaction tube 204 different from the gas introduction unit 230 to exhaust an atmosphere in the reaction tube 204 through an exhaust port 231a.

A gas supply pipe 232 is connected to the gas introduction unit 230. A process gas supply source, a carrier gas supply source and an inert gas supply source (not shown) are connected to an upstream side of the gas supply pipe 232 opposite to a connection side to the gas introduction unit 230 via a mass flow controller (MFC) 241, which is a gas flow rate controller. In addition, when supply of moisture into the process chamber 201 is needed, a vapor generation apparatus (not shown) is installed at the gas supply pipe 232 at a downstream side of the MFC 241. A gas flow rate control unit 235 is electrically connected to the MFC 241, and configured to control the MFC 241 at a desired timing such that a flow rate of a gas to be supplied reaches a desired amount.

A gas exhaust pipe 229 is connected to the gas exhaust unit 231. An exhaust apparatus 246 is connected to a downstream side of the gas exhaust pipe 229 at an opposite side of a connection side to the gas exhaust unit 231 via a pressure sensor 245 and a pressure regulation apparatus 242, which are pressure detectors, and configured to exhaust a pressure in the process chamber 201 to a predetermined pressure. A pressure control unit 236 is electrically connected to the pressure regulation apparatus 242 and the pressure sensor 245, and configured to control the pressure regulation apparatus 242 at a desired timing such that the pressure in the process chamber 201 reaches a desired pressure by the pressure regulation apparatus 242 based on the pressure detected by the pressure sensor 245.

A base 257, which is a holding body, and a seal cap 219, which is a furnace port cover, are installed at a lower end of the reaction tube 204 to hermetically seal an opening of the lower end of the reaction tube 204. The seal cap 219 is made of a metal such as stainless steel, and formed in a disc shape. The base 257 is made of, for example, quartz, formed in a disc shape, and installed on the seal cap 219. An O-ring 220, which is a seal member, in contact with a lower end of the reaction tube 204 is installed at an upper surface of the base 257. A rotary mechanism 254 for rotating the boat is installed at the seal cap 219 opposite to the process chamber 201. A rotary shaft 255 of the rotary mechanism 254 passes through the seal cap 219 and the base 257 to be connected to an insulating tube 218 to be described later and the boat 217. The rotary mechanism 254 is configured to rotate the insulating tube 218 and the boat 217 to rotate the wafers 200. The seal cap 219 is configured to be vertically elevated by a boat elevator 115, which is an elevation mechanism vertically installed at an exterior of the reaction tube 204, and thus, the boat 217 can be loaded into or unloaded from the process chamber 201. A drive control unit 237 is electrically connected to the rotary mechanism 254 and the boat elevator 115, and configured to control the rotary mechanism 254 and the boat elevator 115 to perform a desired operation at a desired timing.

The boat 217, which is a substrate holder, is formed of a heat-resistance material such as quartz or silicon carbonate, and configured to horizontally align and hold the plurality of wafers 200 in a concentrically aligned state. The insulating tube 218, which is a cylindrical insulating member formed of a heat-resistance material such as quartz or silicon carbonate, is installed under the boat 217 to support the boat 217 such that heat from the heater 206 cannot be easily transferred to a lower end side of the reaction tube 204.

Two kinds of sensors are installed at the process furnace 202 as temperature detectors. That is, a plurality of internal temperature sensors 263, which are temperature detectors, are installed between the heat distribution tube 205 and the reaction tube 204, and a plurality of external temperature sensors 264, which are temperature detectors, are installed between the heat distribution tube 205 and the heater 206. The internal temperature sensors 263 and the external temperature sensors 264 detect temperatures using thermocouples. For example, the internal temperature sensors 263 use B-type thermocouples and the external temperature sensors 264 use R-type thermocouples to detect temperatures. Description of the internal temperature sensors 263 and the external temperature sensors 264 will be provided later. A temperature control unit 238 is electrically connected to the heater 206, the internal temperature sensors 263 and the external temperature sensors 264. The temperature control unit 238 is configured to control a conduction state to the heater 206 at a desired timing to accomplish a desired temperature distribution of the temperature in the process chamber 201 by adjusting the conduction state to the heater based on temperature information detected by the internal temperature sensors 263 and the external temperature sensors 264.

The gas flow rate control unit 235, the pressure control unit 236, the drive control unit 237, and the temperature control unit 238 constitute an operation part and an input/output part, and are electrically connected to a main control unit 239 to control the entire substrate processing apparatus. The gas flow rate control unit 235, the pressure control unit 236, the drive control unit 237, the temperature control unit 238 and the main control unit 239 are constituted as a controller 240.

Next, as one process of a method of manufacturing a semiconductor device, a method of performing a treatment such as oxidation, diffusion, and so on, on the wafers 200 using the process furnace 202 according to the above configuration will be described. In addition, in the following description, operations of the respective parts constituting the substrate processing apparatus are controlled by the controller 240.

When the plurality of wafers 200 are charged in the boat 217 (wafer charging), as shown in FIG. 1, the boat 217 holding the plurality of wafers 200 is elevated by the boat elevator 115 to be loaded into the process chamber 201 (boat loading). In this state, the seal cap 219 seals the lower end of the reaction tube 204 via the base 257 and the O-ring 220.

The interior of the process chamber 201 is exhausted by the exhaust apparatus 246 to a desired pressure. At this time, the pressure in the process chamber 201 is measured by the pressure sensor 245, and the pressure regulator 242 is feedback-controlled based on the measured pressure. In addition, the interior of the process chamber 201 is heated by the heater 206 to a desired temperature. At this time, a conduction state to the heater 206 is feedback-controlled based on temperature information detected by the internal temperature sensors 263 and the external temperature sensors 264, which are temperature detectors, such that the interior of the process chamber 201 reaches a desired temperature distribution. Further, control of the heater 206 based on the temperature information detected by the temperature detectors will be described below in detail. Then, the insulating tube 218 and the boat 217 are rotated by the rotary mechanism 254 to rotate the wafers 200.

Next, the gas supplied from the process gas supply source and the carrier gas supply source and controlled by the MFC 241 to a desired flow rate flows through the gas introduction unit 230 and the narrow tube 234 via the gas supply pipe 232 to arrive at the ceiling unit 233, and is introduced into the process chamber 201 via the plurality of gas introduction ports 233a in a shower shape. In addition, when the wafers 200 are treated using vapor, the gas controlled by the MFC 241 to a desired flow rate is supplied to a vapor generating apparatus, and the gas including vapor ($H_2O$) generated from the vapor generating apparatus is introduced into the process chamber 201. The introduced gas flows downward in the process chamber 201 and is exhausted through the gas exhaust unit 231 via the exhaust port 231a. The gas contacts surfaces of the wafers 200 to perform a treatment such as oxidation, diffusion, and so on, on the wafers 200 when the gas passes through the process chamber 201.

When a preset process time elapses, an inert gas is supplied from the inert gas supply source such that the interior of the process chamber 201 is substituted by the inert gas and the pressure in the process chamber 201 returns to a normal pressure as well.

Thereafter, the seal cap 219 is lowered by the boat elevator 115 so that the processed wafers 200 are unloaded to the exterior of the reaction tube 204 from the lower end of the reaction tube 204 (boat unloading) in a state in which the wafers 200 are held by the boat 217, while the lower end of the reaction tube 204 is open. Next, the processed wafers 200 are discharged from the boat 217 (wafer discharging).

The above-described processes become a series of processes for performing a treatment such as oxidation, diffusion, and so on, on the wafers 200. Next, in the embodiment, the temperature detector and control of the heater 206 using the temperature detector will be described in detail.

When the temperature in the heat treatment furnace is detected, temperature detection is generally performed using the R-type thermocouple as a temperature sensor; whereas, under a high temperature environment, the R-type thermocouple may be cut early on. To overcome this problem, the B-type thermocouple, which is a thermocouple having better heat resistance than the R-type thermocouple, is used in this embodiment. The B-type thermocouple has better heat resistance because when rhodium is added to platinum, mechanical strength is increased so that the thermocouple cannot be easily cut due to deformation. In addition, as a content of rhodium is reduced, a crystal grain becomes coarse, and thus it is noted that, when the content of rhodium is increased, formation of a coarse crystal grain may be relatively suppressed. Accordingly, it is expected that reduction in strength of a crystal grain boundary can be suppressed when the crystal grain becomes coarse.

Figure 2:
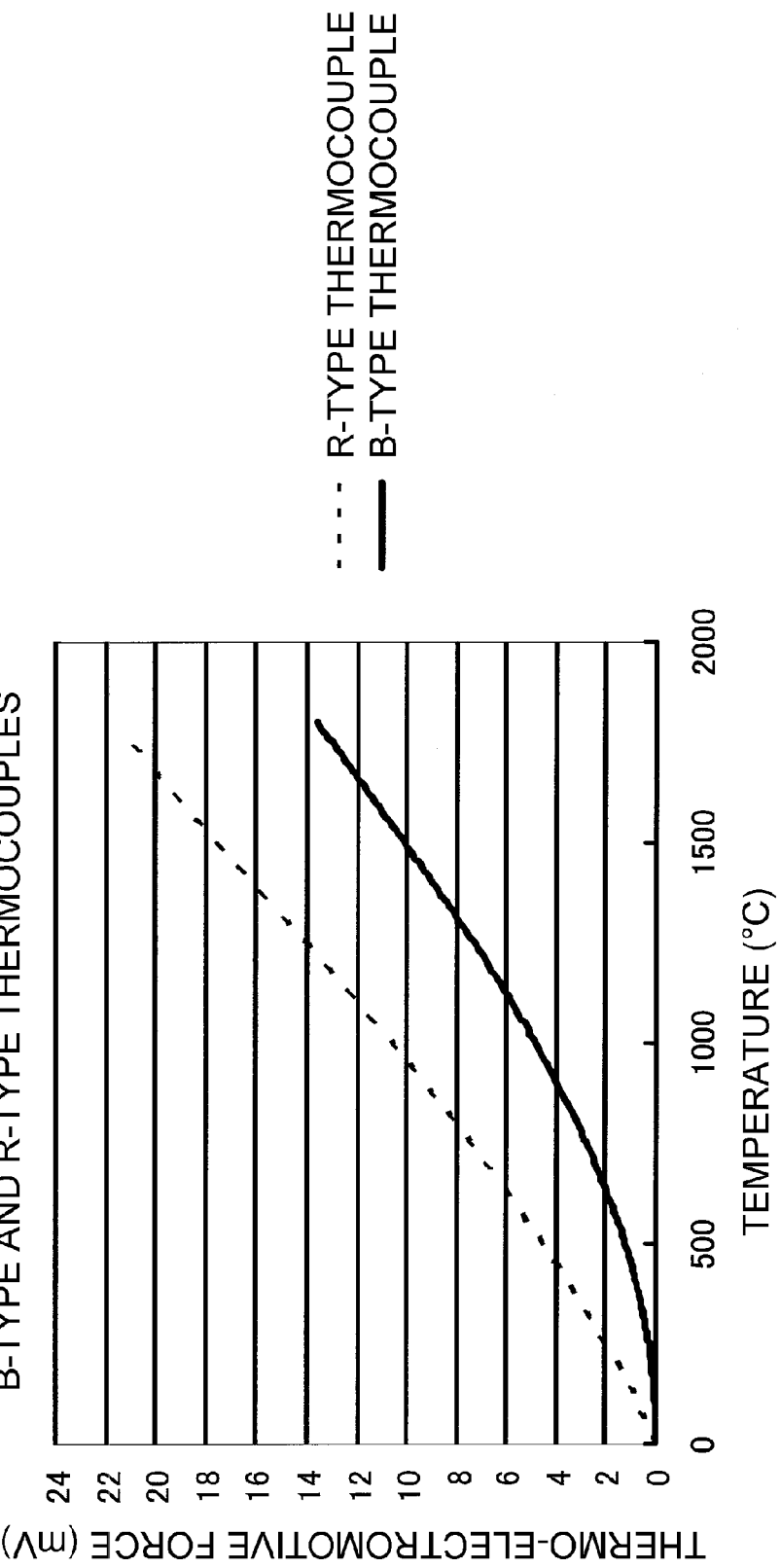
FIG. 2 is a view showing temperature characteristics of a B-type thermocouple and an R-type thermocouple in accordance with the first embodiment of the present invention.

However, use of the B-type thermocouple may cause the following problems. FIG. 2 is a view showing temperature characteristics of the B-type thermocouple and the R-type thermocouple. In addition, in this figure, a temperature (° C.) and a thermo-electromotive force (mV) are plotted on a horizontal axis and a longitudinal axis, respectively, based on a reference thermo-electromotive force table of JIS C1602. From FIG. 2, it will be appreciated that the B-type thermocouple has a thermo-electromotive force smaller than that of the R-type thermocouple in any region thereof. For example, a thermo-electromotive force at 1200° C. is 13.228 mV in the R-type thermocouple and 6.786 mV in the B-type thermocouple, which is smaller than that of the R-type thermocouple. In addition, a thermo-electromotive force at 600° C. is 5.583 mV in the R-type thermocouple and 1.792 mV in the B-type thermocouple, which is smaller than that of the R-type thermocouple. Since the B-type has a small thermo-electromotive force as described above, a measurement error may easily occur, in particular, at a low-temperature region (250° C. or lower), and measurement precision may be deteriorated.

Figure 3:
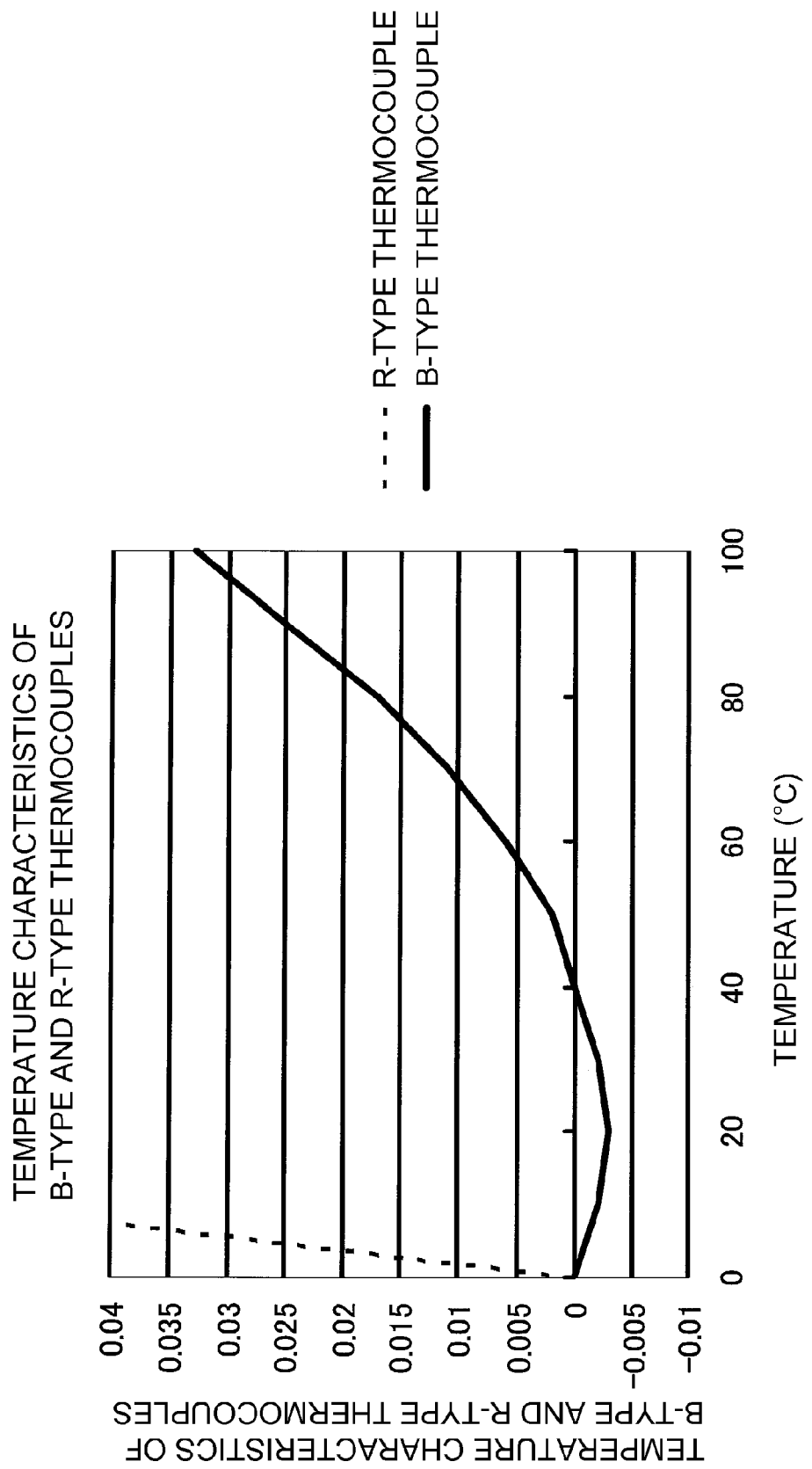
FIG. 3 is an enlarged view showing the temperature characteristics of the B-type thermocouple and the R-type thermocouple in accordance with the first embodiment of the present invention.

In addition, since the B-type thermocouple can have a negative thermo-electromotive force, a temperature cannot be particularly designated. FIG. 3 is an enlarged view of a portion of 0° C. to 100° C. of the graph of FIG. 2. The B-type thermocouple is characterized in that the thermo-electromotive force has a negative value at a temperature of 40° C. or lower, and the same value at the other temperatures. For this reason, when a negative value of thermo-electromotive force is detected, the temperature cannot be specified.

As described above, it is difficult to use the B-type thermocouple as a temperature detector. From this, in this embodiment, an internal temperature sensor 263 using the B-type thermocouple as a temperature detector and an external temperature sensor 264 using the R-type thermocouple as a temperature detector are installed, a temperature of the heater 206 is controlled using only the external temperature sensor 264 under an environment of less than a threshold temperature T, and a temperature of the heater 206 is controlled using the internal temperature sensor 263 and the external temperature sensor 264 under an environment of the threshold temperature T or higher. In addition, the internal temperature sensor 263 and the external temperature sensor 264 calculate a temperature from a detected thermo-electromotive force by a temperature/thermo-electromotive force conversion table based on temperature characteristics shown in FIG. 2.

Figure 4:
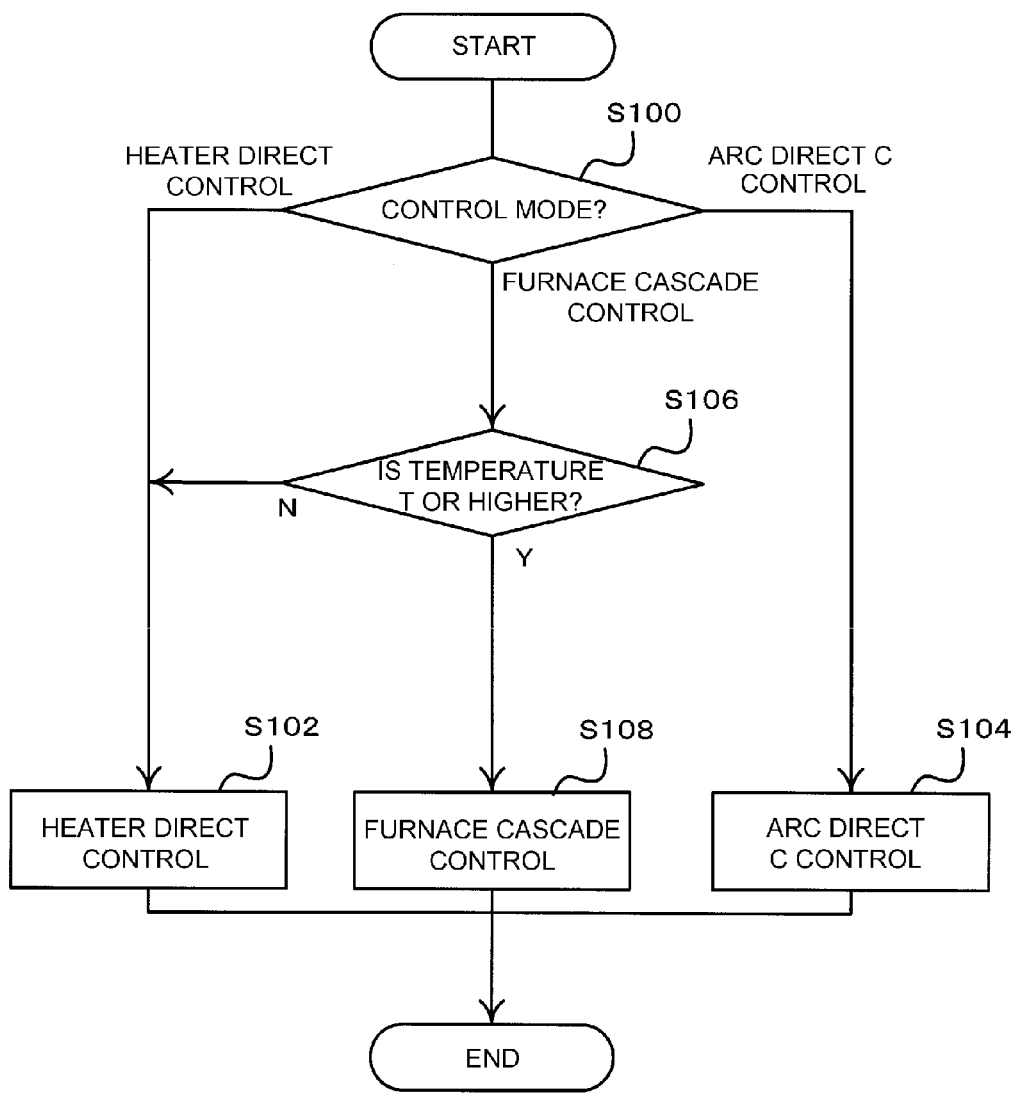
FIG. 4 is a view showing a flowchart of temperature control in accordance with the first embodiment of the present invention.

FIG. 4 is a view showing a flowchart of temperature control in this embodiment. According to the flowchart, a method of controlling a temperature of the heater 206 will be described.

In step S100, the method of controlling a temperature of the heater 206 is selected. In this embodiment, the control method includes three control modes, for example, heater direct control, furnace cascade control, and ARC direct C control, and in step S100, any one control mode is selected.

In addition, in this embodiment, in treatment of step S100, while any one of the three control modes including the heater direct control, the furnace cascade control and the ARC direct C control is selected, a separate control mode may be further added, or the ARC direct C control may not be provided.

In step S100, when the heater direct control is selected as a control mode, treatment of step S102 is performed, when the ARC direct C control is selected, treatment of step S104 is performed, and when the furnace cascade control is selected, treatment of step S106 is performed.

In step S102, until the control mode is switched or the temperature control of the heater 206 is terminated, the heater direct control is performed to control the temperature of the heater 206 based on a detected temperature of the external temperature sensor 264.

In step S104, until the control mode is switched or the temperature control of the heater 206 is terminated, the ARC direct C control is performed to control the temperature of the heater 206, regardless of detected temperatures of the internal temperature sensor 263 and the external temperature sensor 264.

In step S106, a temperature detected by the internal temperature sensor 263 is checked. When the detected temperature is the threshold temperature T or higher, treatment of step S108 is performed, and the furnace cascade control is performed. In addition, when the detected temperature is less than the threshold temperature T, treatment of step S102 is performed, and the heater direct control is performed. The heater direct control is to control the temperature of the heater 206 with no use of the detected temperature of the internal temperature sensor 263. For this reason, when the detected temperature is less than the threshold temperature T, stable feedback control by the heater direct control can be stably performed without affecting characteristics in a low-temperature region of the B-type thermocouple used in the internal temperature sensor 263. For example, when the threshold temperature T is set to 250° C., stable control can be performed without generation of a measurement error and effects due to the problem of the B-type thermocouple, in which the temperature is not specified.

In addition, in step S106, the control mode is switched such that the internal temperature sensor 263 in which the B-type thermocouple is used is not affected in the low-temperature region. Accordingly, while it is preferable that the temperature detected by the internal temperature sensor 263 is checked to compare the detected temperature with the threshold temperature T, the temperature detected by the external temperature sensor 264 may be checked to compare the detected temperature with the threshold temperature T to switch the control mode.

Further, as a step just before treatment of step S106, a step of determining whether the internal temperature sensor 263 is the B-type thermocouple or the R-type thermocouple may be provided. When the determination step is provided, the treatment of step S106 is performed when the internal temperature sensor 263 is constituted by the B-type thermocouple like this embodiment. However, when the internal temperature sensor 263 is constituted by the R-type thermocouple, the treatment of step S108 is performed to perform the furnace cascade control, not performing the treatment of step S106.

In step S108, until the temperature detected by the internal temperature sensor 263 is less than the threshold temperature T or the temperature control of the heater 206 is terminated, the furnace cascade control by the internal temperature sensor 263 and the external temperature sensor 264 is performed to control the temperature of the heater 206.

As described above, the substrate processing apparatus according to this embodiment switches the furnace cascade control, which is controlled based on the detected temperatures of the internal temperature sensor 263 and the external temperature sensor 264, and the heater direct control, in which the detected temperature of the internal temperature sensor 263 is not used, according to the temperature, the temperature control of the heater 206 can be stably performed, without affecting the low-temperature region by the B-type thermocouple.

Figure 5:
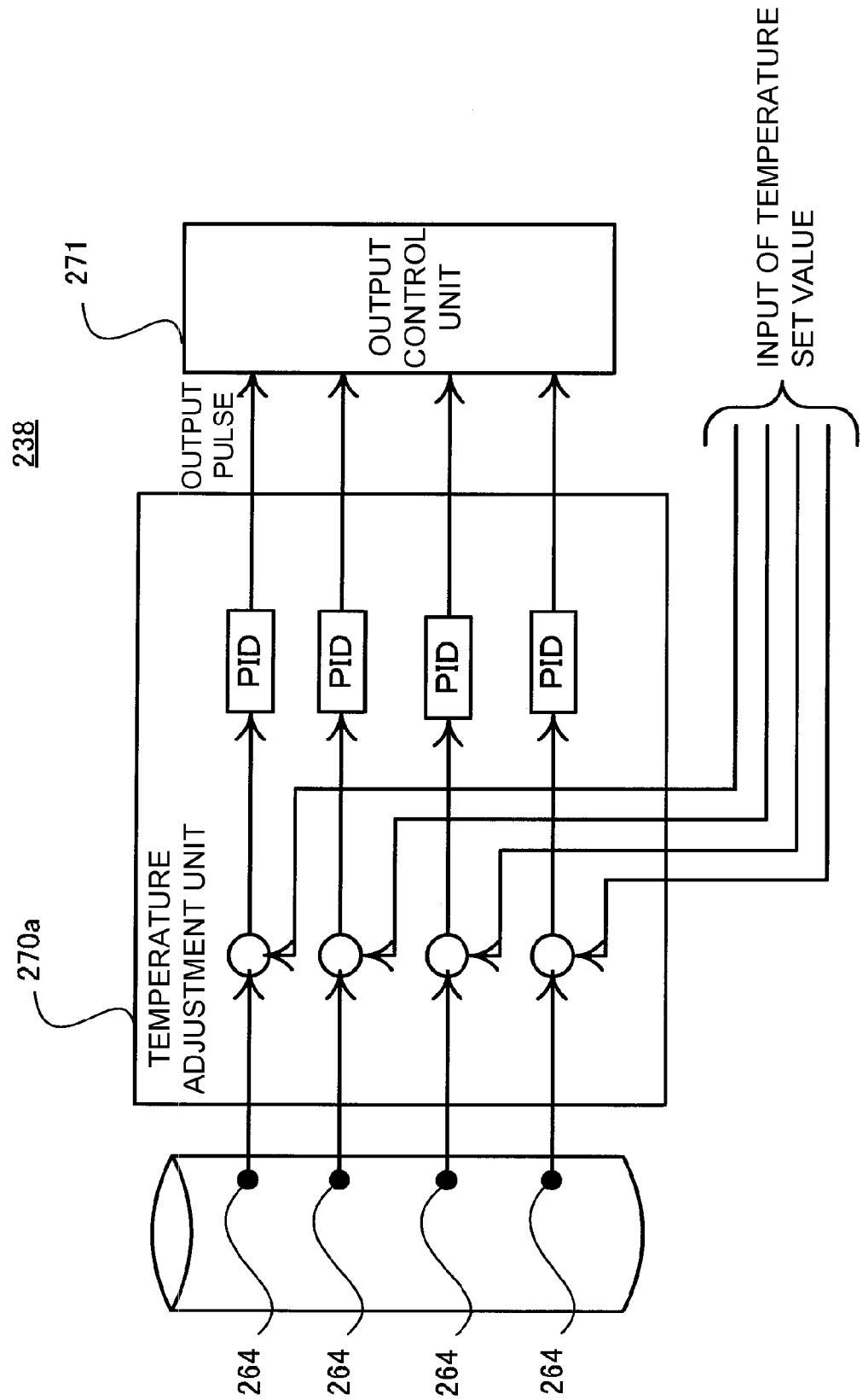
FIG. 5 is a configuration diagram showing a temperature control unit 238 when a control mode in accordance with the first embodiment of the present invention is a heater direct control mode.

Here, a control mode selected in step S100 will be described. FIG. 5 is a view showing a configuration of the temperature control unit 238 when the control mode is the heater direct control. In the heater direct control, a temperature adjustment unit 270a performs PID control such that temperatures measured at the thermocouples (the external temperature sensors 264) inserted into a plurality of zones around the heater, for example, between the heat distribution tube 205 and the heater 206, are matched to a set temperature value, and outputs an output pulse to an output control unit 271. Then, the output control unit 271 controls the temperature of the heater 206 based on the output pulse, which has been input.

Figure 6:
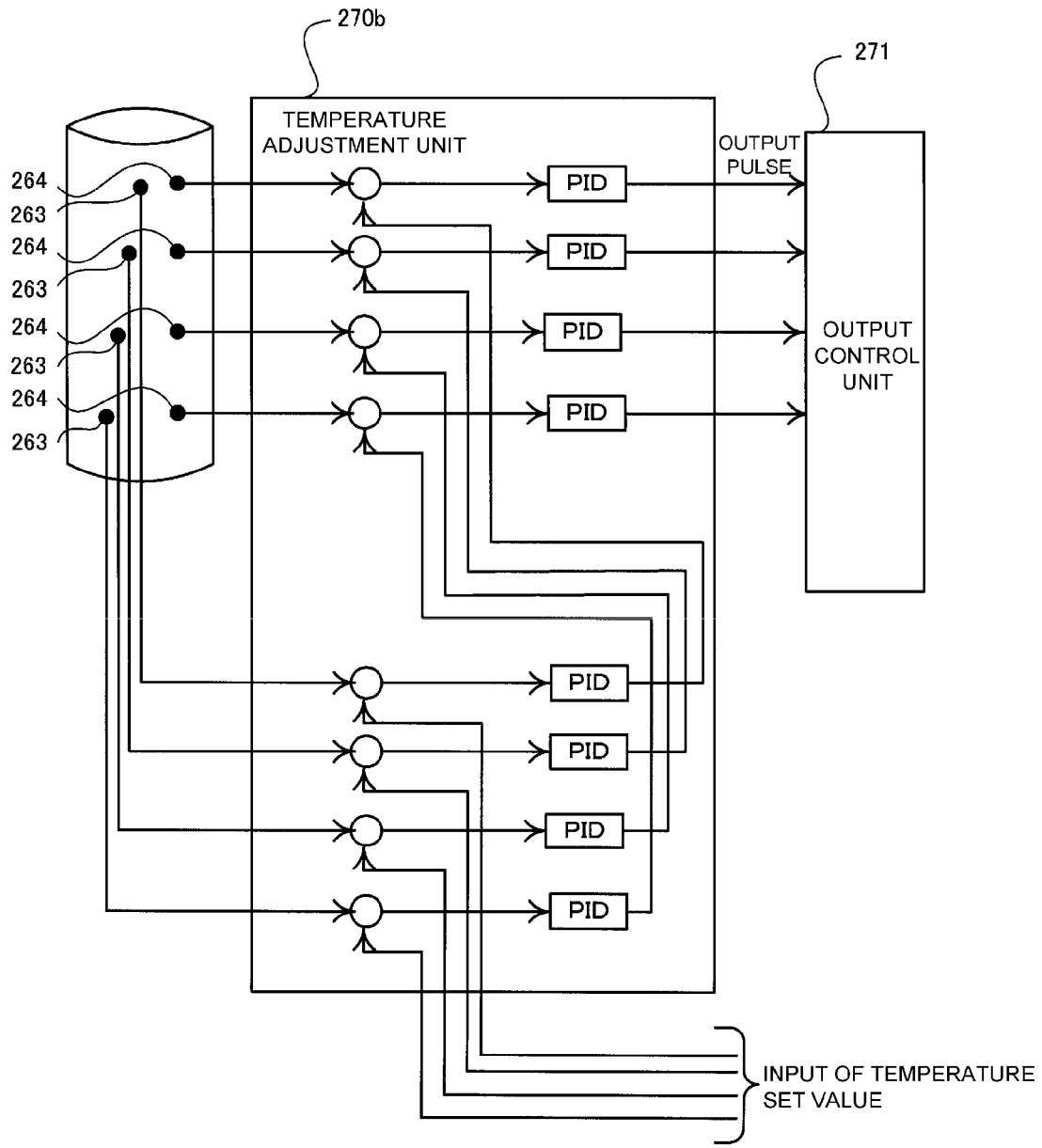
FIG. 6 is a configuration diagram showing the temperature control unit 238 when a control mode in accordance with the first embodiment of the present invention is a furnace cascade control mode.

FIG. 6 is a view showing a configuration of the temperature control unit 238 when the control mode is the furnace cascade control. A temperature adjustment unit 270b in the furnace cascade control performs PID control using temperatures measured by the thermocouples (the internal temperature sensors 263) inserted into a plurality of zones in the process furnace, for example, between the heat distribution tube 205 and the reaction tube 204, and temperature measured by the thermocouples (the external temperature sensors 264) inserted into a plurality of zones around the heater. Here, the PID control by the internal temperature sensors 263 and the PID control by the external temperature sensors 264 constitute a control loop in series and perform dual feedback control.

The ARC direct C control is an open loop control in which the heater is directly controlled by a C operation only with respect to the respective zones of the heater. Here, the C operation is an operation of outputting a certain value (compensation: C) represented by a compensation pattern, which is a function of time.

Figure 7:
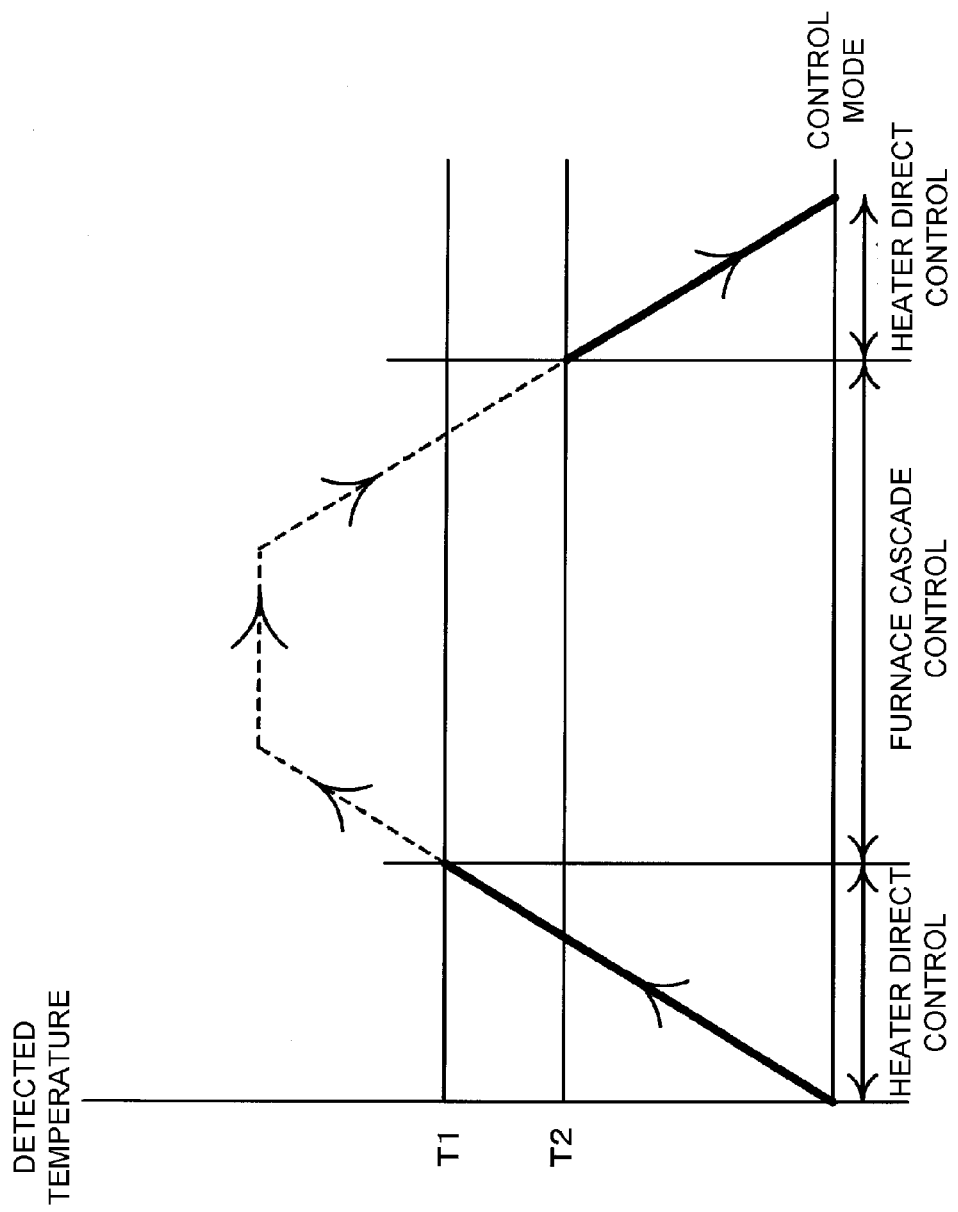
FIG. 7 is a view showing a relation between a threshold temperature T1 and a threshold temperature T2 and a control mode according to a variation of the first embodiment of the present invention.

Hereinafter, a variation of this embodiment will be described. This variation is distinguished from the above embodiment in that T1 and T2 are provided as threshold temperatures in treatment of step S106. FIG. 7 is a view showing relation between the threshold temperatures T1 and T2 and the control mode. Here, a solid line in the drawing represents that the heater direct control is performed, and a dotted line represents that the furnace cascade control is performed. In treatment of step S106, when the temperature detected by the internal temperature sensor 263 is increased, but the detected temperature is less than the threshold temperature T1, treatment of step S102 is performed to perform the heater direct control. When the detected temperature is further increased to reach the threshold temperature T1 or higher, transition to step S108 is switched, and the control mode is switched to the furnace cascade control. Thereafter, when the detected temperature is T2 or higher, the furnace cascade control is continued, and when the detected temperature is less than T2, transition to step S102 is switched, and the control mode is switched to the heater direct control.

When the control mode is switched by the threshold temperature T only, the detected temperature is repeatedly raised or lowered around the threshold temperature T, and thus, the control mode is repeatedly switched between the heater direct control and the furnace cascade control so that the control may become unstable. However, when the threshold temperatures T1 and T2 are provided to change temperatures at which the control mode is switched upon increase or decrease in detected temperature, repetition of the switching of the control mode around the threshold temperature can be prevented and stable control can be performed.

In the above-described embodiment and variation, while the B-type thermocouple is used in the internal temperature sensor 263 and the R-type thermocouple is used in the external temperature sensor 264, the used thermocouple is not limited thereto. That is, the two kinds of thermocouples (first and second thermocouples) are used in the internal temperature sensor 263 and the external temperature sensor 264, respectively. The first thermocouple has better heat resistance than the second thermocouple, and the second thermocouple has better temperature detection performance than the first thermocouple. In addition, in a temperature region in which the temperature detection performance of the first thermocouple is insufficient, the feedback control may be performed by only the detected temperature of the second thermocouple, and in the other temperature regions, the feedback control may be performed using the detected temperature of the first thermocouple and the detected temperature of the second thermocouple.

In addition, in this embodiment, while the B-type thermocouple is used in the internal temperature sensor 263 and the R-type thermocouple is used in the external temperature sensor 264, in contrast, the R-type thermocouple may be used in the internal temperature sensor 263 and the B-type thermocouple may be used in the external temperature sensor 264. In this case, the heater direct control is used by the internal temperature sensor 263. Further, like this embodiment, use of the B-type thermocouple in the internal temperature sensor 263 and use of the R-type thermocouple in the external temperature sensor 264 may have the following advantages. That is, for example, when the thermocouple is horizontally installed at installation positions of the respective zones of the external temperature sensor 264 and the thermocouple used in the external temperature sensor 264 has a length smaller than that of the thermocouple used in the internal temperature sensor 263, the external temperature sensor 264 has a small load applied to the thermocouple itself, and a short portion of the thermocouple is heated to a high temperature to reduce an elongation due to thermal expansion. Accordingly, a used example of the external temperature sensor 264 is unlikely to be cut in comparison with a used example of the internal temperature sensor 263. For this reason, it is preferable for the B-type thermocouple to be used in the internal temperature sensor 263 and the R-type thermocouple to be used in the external temperature sensor 264.

As described above, in the first embodiment and the variation according to the present invention, lifespan of the temperature sensor can be lengthened. Accordingly, a downtime of the substrate processing apparatus can be reduced and a rate of operation can be improved. In addition, since control of a heating temperature based on the temperature sensor appropriate to the temperature range is performed, lifespan of the temperature sensor may be lengthened without degrading a temperature control precision even when the temperature sensor is used in a high-temperature region.

Figure 8:
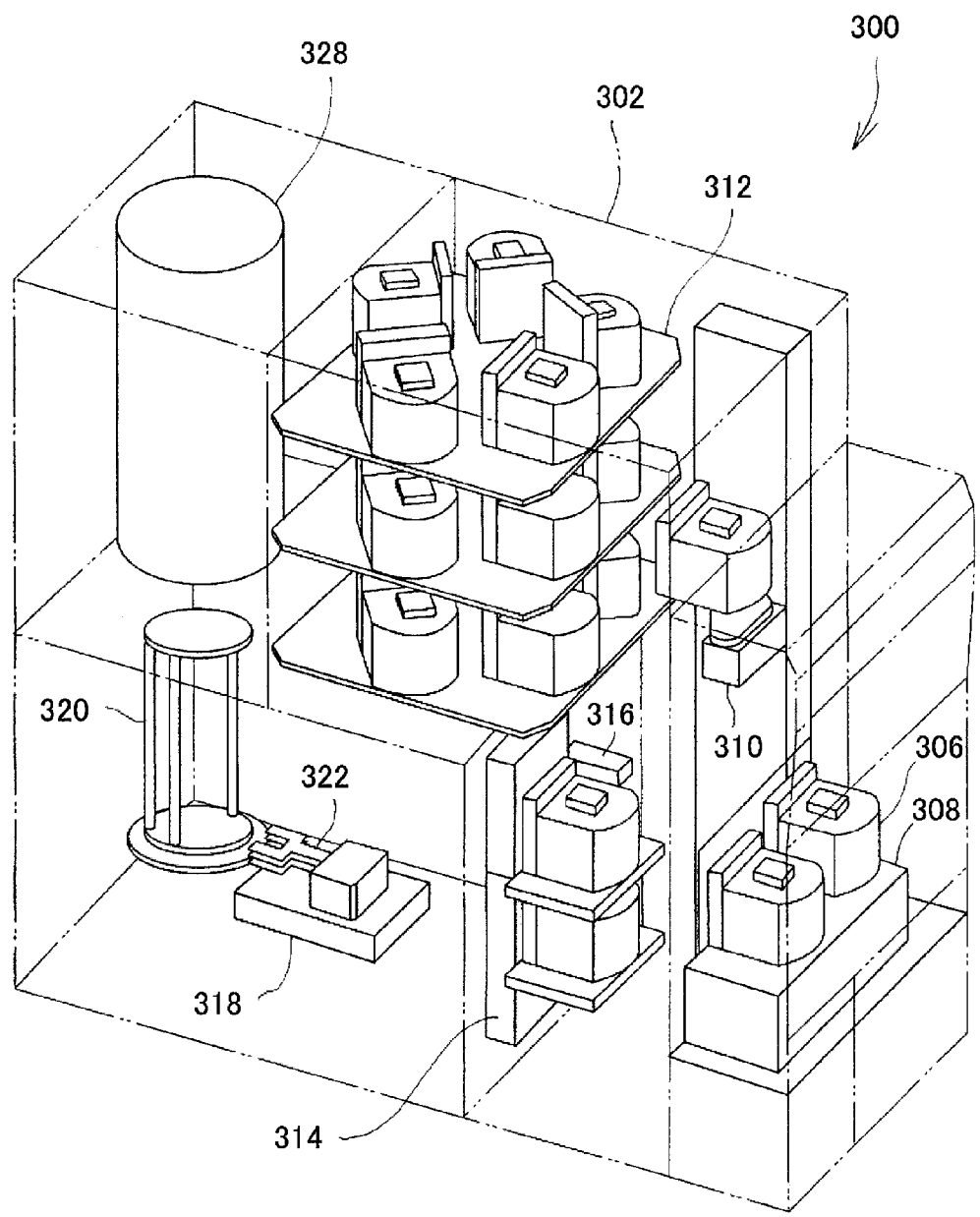
FIG. 8 is a perspective view showing an example of a semiconductor manufacturing apparatus 300 for forming a silicon carbonate (SiC) epitaxial film in accordance with a second embodiment of the present invention.

Hereinafter, the second embodiment of the present invention will be described with reference to the drawings. FIG. 8 is a perspective view showing an example of a semiconductor manufacturing apparatus 300 for forming a SiC epitaxial film according to the second embodiment of the present invention.

The semiconductor manufacturing apparatus 300, which is a substrate processing apparatus (a film-forming apparatus), is a batch-type vertical heat treatment apparatus, which includes a housing 302 in which major parts are disposed. In the semiconductor manufacturing apparatus 300, a front-opening unified pod (FOUP, hereinafter referred to as a pod) 306, which is a substrate receptor for receiving a wafer 304 (see FIG. 9) as a substrate formed of, for example, SiC, is used as a wafer carrier. A pod stage 308 is disposed at a front side of the housing 302, and the pod 306 is conveyed to the pod stage 308. For example, twenty-five sheets of wafers 304 are accommodated in the pod 306, and are set on the pod stage 308 with a cover closed.

A pod conveyance apparatus 310 is disposed at a front side in the housing 302 opposite to the pod stage 308. In addition, a pod receiving shelf 312, a pod opener 314 and a substrate number detector 316 are disposed adjacent to the pod conveyance apparatus 310. The pod receiving shelf 312 is disposed over the pod opener 314, and configured to hold a plurality of pods 306 placed thereon. The substrate number detector 316 is disposed adjacent to the pod opener 314, and the pod conveyance apparatus 310 conveys the pod 306 between the pod stage 308, the pod receiving shelf 312 and the pod opener 314. The pod opener 314 opens a cover of the pod 316, and the substrate number detector 316 detects the number of wafers 304 in the cover-opened pod 306.

A substrate transfer apparatus 318, and a boat 320, which is a substrate holder, are disposed in the housing 302. The substrate transfer apparatus 318 includes an arm (tweezers) 322, and is configured to be elevated and rotated by a drive unit (not shown). The arm 322 can extract, for example, five sheets of wafers 304. As the arm 322 is moved, the wafers 304 are conveyed between the pod 306 and the boat 320 disposed at a position of the pod opener 314.

The boat 320 is formed of a heat-resistance material such as carbon graphite or SiC, and configured to concentrically align the plurality of wafers 304 in a horizontal posture, and stack and hold the wafers 304 in a vertical direction. In addition, a boat insulating unit 324, which is a disk-shaped insulating member formed of a heat-resistance material such as quartz or SiC, is disposed at a lower part of the boat 320, so that heat from a subject to be heated (a subject to be induced) 326, which will be described later, cannot be easily transferred to a lower side of the process furnace 328 (see FIG. 9).

The process furnace 328 is disposed at an upper part of a rear side in the housing 302. The boat 320, on which the plurality of wafers 304 are loaded, is conveyed into the process furnace 328 to perform heat treatment.

Hereinafter, the process furnace 328 of the semiconductor manufacturing apparatus 300 for forming a SiC epitaxial film will be described.

Figure 9A:
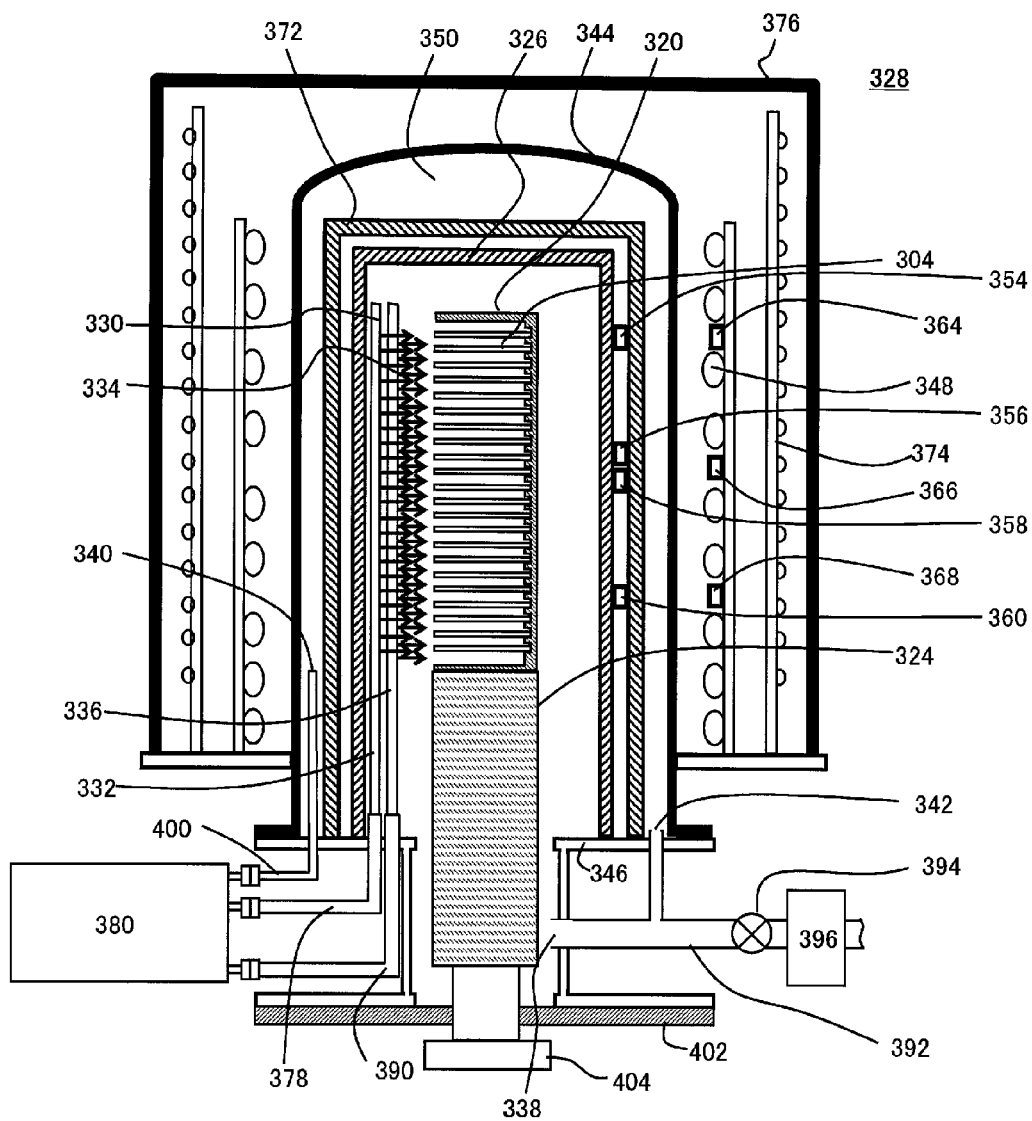
FIG. 9A is a side cross-sectional view showing an example of a process furnace 328 in accordance with the second embodiment of the present invention.
Figure 9B:
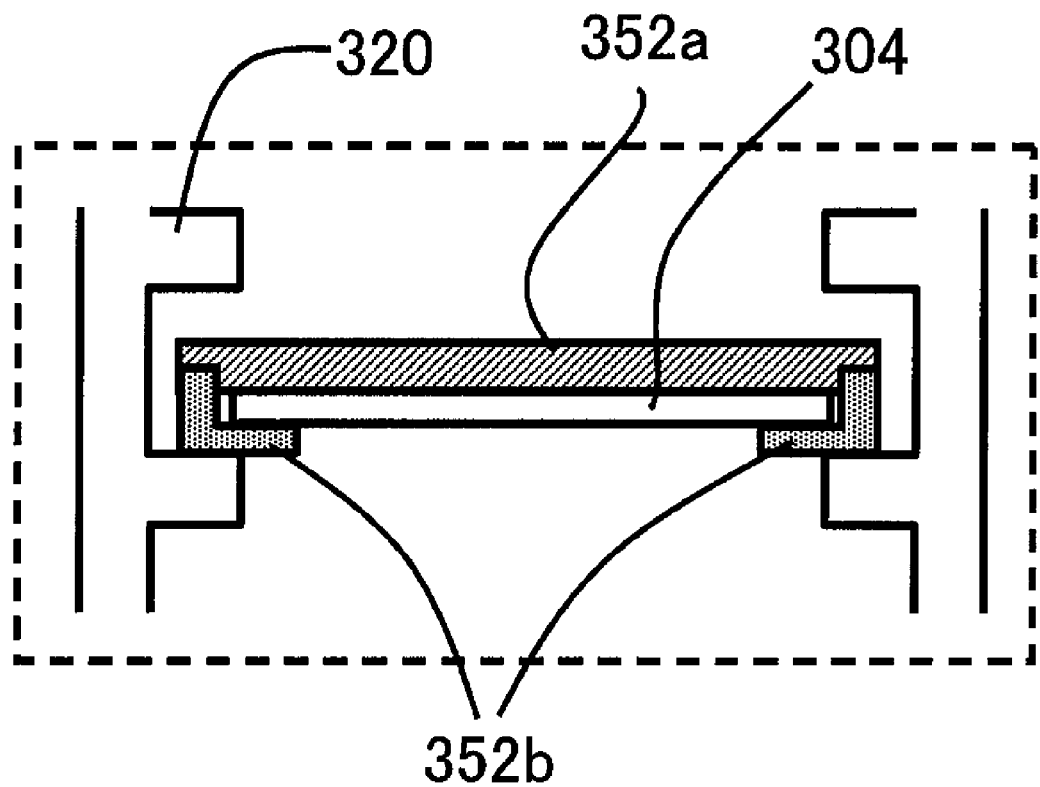
FIG. 9B is a side cross-sectional view of a wafer 304 supported by a boat 320.

FIG. 9A is a side cross-sectional view showing an example of the process furnace 328 according to the second embodiment of the present invention, and FIG. 9B is a side cross-sectional view of the wafers 304 supported by the boat 320.

In the process furnace 328, a first gas supply nozzle 332 including a first gas supply port 330, a second gas supply nozzle 336 including a second gas supply port 334, and a first gas exhaust port 338 are installed. In addition, a third gas supply port 340 into which an inert gas is supplied and a second gas exhaust port 342 are shown.

The process furnace 328 includes a reaction tube 344 formed of a heat-resistance material such as quartz or SiC and having a cylindrical shape with an upper end closed and a lower end opened. A manifold 346 is disposed under the reaction tube 344 so as to be concentric with the reaction tube 344. The manifold 346 is formed of, for example, stainless steel, and has a cylindrical shape with upper and lower ends opened. The manifold 346 is installed to support the reaction tube 344. Meanwhile, an O-ring (not shown), which is a seal member, is installed between the manifold 346 and the reaction tube 344. As the manifold 346 is supported by a holding body (not shown), the reaction tube 344 is vertically installed. A reaction vessel is formed by the reaction tube 344 and the manifold 346.

The process furnace 328 includes a body to be heated (a body to be induced) 326 having a cylindrical shape with an upper end closed and a lower end opened, and an induction coil 348, which is a magnetic field generation part. The interior of the reaction tube 344 has a reaction chamber 350 formed therein, and is configured to receive the boat 320 holding the wafers 304 as substrates formed of SiC. The body to be heated 326 is heated by a magnetic field generated by the induction coil 348 installed outside the reaction tube 344, and the interior of the reaction tube 350 is heated as the body to be heated 326 is heated.

In addition, as shown in FIG. 9B, the wafer 304 may be held by a lower wafer holder 352b having an annular shape, and may be held on the boat 320 with an upper surface of the wafer covered by an upper wafer holder 352a. As a result, the wafer 304 can be protected from particles dropped from an upper side of the wafer, and formation of a film on a rear side of a film-forming surface (a lower surface of the wafer 304) can be suppressed. Further, since the film-forming surface can be separated from a boat post by the wafer holders 352a and 352b, an effect of the boat post can be reduced. The boat 320 is configured to hold the wafers 304 held by the wafer holders 352a and 352b such that the wafers 304 are concentrically aligned in a horizontal posture in a vertical direction.

A temperature sensor, which is a temperature detector, is installed adjacent to the body to be heated 326 to detect a temperature in the reaction chamber 350. As the temperature sensor, for example, radiation thermometers 354, 356, 358 and 360 are disposed around the body to be heated 326 at three zones divided in a longitudinal direction. The radiation thermometer 354 is disposed at an upper zone of the three longitudinal zones, the radiation thermometers 356 and 358 are disposed at a middle zone of the three longitudinal zones, and the radiation thermometer 360 is disposed at a lower zone of the three longitudinal zones.

The radiation thermometer 354 disposed at the upper zone and the radiation thermometer 360 disposed at the lower zone are provided for monitoring. According to a purpose, any one of a low-temperature radiation thermometer and a high-temperature radiation thermometer is disposed. In the radiation thermometers 356 and 358 disposed at the middle zone, the radiation thermometer 356 is a high-temperature radiation thermometer, and the radiation thermometer 358 is a low-temperature radiation thermometer. The radiation thermometers 356 and 358 are disposed to measure temperatures of the same place, and perform the temperature control by switching the radiation thermometer 356, which is a high-temperature radiation thermometer, and the radiation thermometer 358, which is a low-temperature radiation thermometer.

Here, when a maximum temperature and a minimum temperature of a temperature range detectable by the high-temperature radiation thermometer are defined as a upper limit for a high temperature Max_High and a lower limit for a high temperature Min_High, respectively, and a maximum temperature and a minimum temperature of a temperature range detectable by the low-temperature radiation thermometer are defined as a upper limit for a low temperature Max_Low and a lower limit for a low temperature Min_Low, respectively, the high-temperature radiation thermometer and the low-temperature radiation thermometer have the following relation. That is, the upper limit for a high temperature Max_High is higher than the upper limit for a low temperature Max_Low, and the lower limit for a high temperature Min_High is higher than the lower limit for a low temperature Min_Low.

Figure 10:
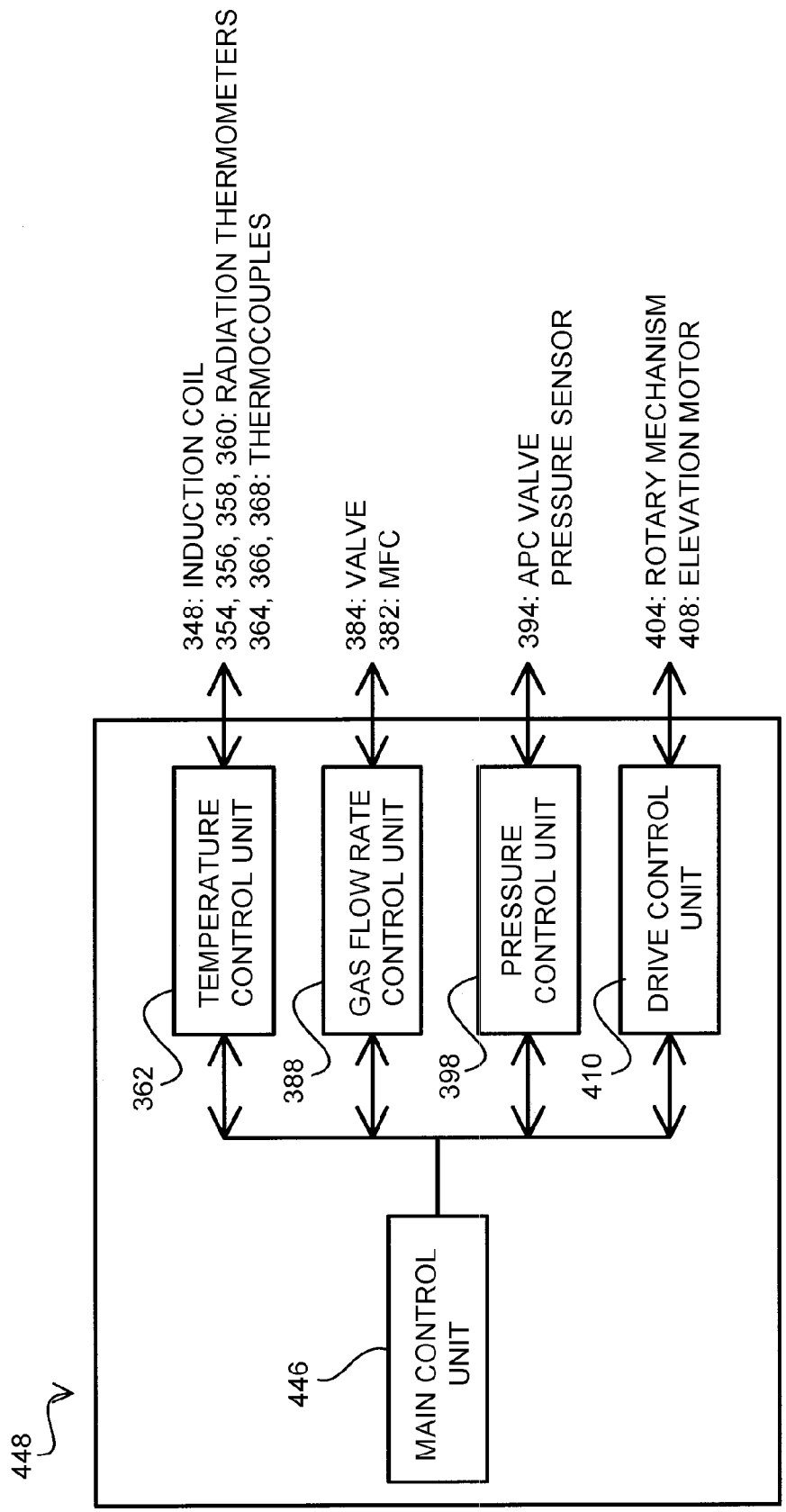
FIG. 10 is a block diagram showing an example of a control configuration of the semiconductor manufacturing apparatus 300 in accordance with the second embodiment of the present invention.

FIG. 10 is a block diagram showing an example of a control configuration of the semiconductor manufacturing apparatus 300 according to the second embodiment of the present invention. The induction coil 348 and the radiation thermometers 354, 356, 358 and 360 are electrically connected to a temperature control unit 362 shown in FIG. 10. The temperature control unit 362 is configured to adjust a conduction state to the induction coil 348 based on temperature information detected by the radiation thermometer 356 or the radiation thermometer 358, and control the temperature in the reaction chamber 350 to a desired temperature distribution at a predetermined timing. For example, with respect to the induction coil 348, which is an induction heater driven by a high-frequency power and having a cylindrical shape, the temperature control unit 362 drives the high-frequency power to compare the temperature information detected by the radiation thermometer 356 or the radiation thermometer 358 with a set temperature to output an appropriate calorie.

In addition, the temperature control unit 362 performs the control based on the temperature information detected by the radiation thermometer 356 and the control based on the temperature information detected by the radiation thermometer 358 through the following switching manner.

Further, thermocouples 364, 366 and 368 are disposed in three zones longitudinally divided around the induction coil 348. The thermocouple 364 is disposed in an upper zone of the three longitudinal zones, the thermocouple 366 is disposed in a middle zone of the three longitudinal zones, and the thermocouple 368 is disposed in a lower zone of the three longitudinal zones. The thermocouples 364, 366 and 368 are used for protection from overheating and electrically connected to the temperature control unit 362.

Figure 11:
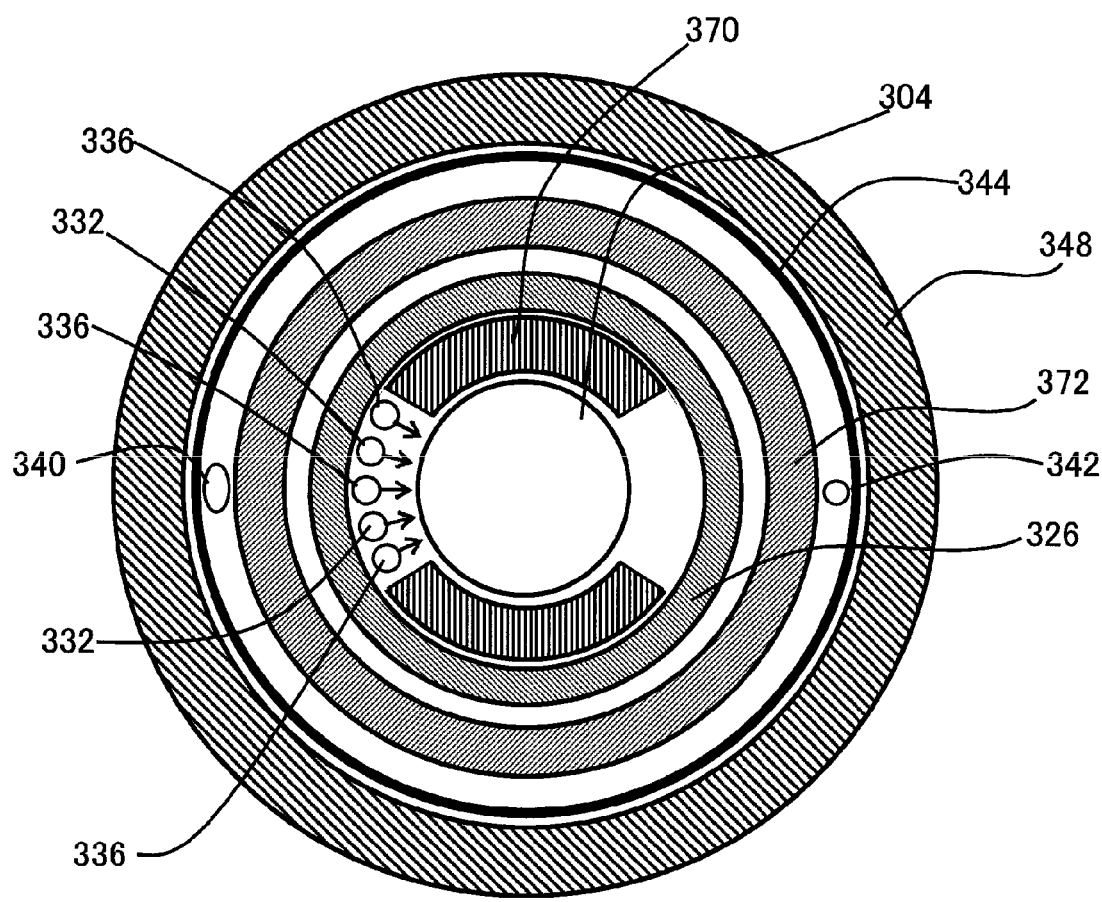
FIG. 11 is a plan cross-sectional view showing an example of the process furnace 328 in accordance with the second embodiment of the present invention.

Furthermore, preferably, between the first and second gas supply nozzles 332 and 336 and the first gas exhaust port 338 in the reaction chamber 350, i.e., between the body to be heated 326 and the wafer 304, structures 370 vertically extending and having an arc-shaped cross-section may be installed in the reaction chamber 350 to bury a space between the body to be heated 326 and the wafer 304. FIG. 11 is a plan cross-sectional view showing an example of the process furnace 328 according to the second embodiment of the present invention. For example, as shown in FIG. 11, the structures 370 installed at opposite positions can prevent the gas supplied through the first and second gas supply nozzles 332 and 336 from bypassing the wafer 304 along an inner wall of the body to be heated 326. The structures 370 can increase heat resistance and suppress generation of particles when the structures are formed of, preferably, an insulating material or a carbon felt.

An insulating material 372 formed of a carbon felt, which cannot easily become dielectric, is installed between the reaction tube 344 and the body to be heated 326, and thus, transfer of heat from the body to be heated 326 to the reaction tube 344 or the exterior of the reaction tube 344 can be suppressed.

In addition, in order to suppress transfer of the heat in the reaction chamber to the outside, an outer insulating wall 374 having, for example, a water cooling structure is installed outside the induction coil 348 to surround the reaction chamber 350. Further, a magnetic seal 376 is installed outside the outer insulating wall 374 to prevent leakage of a magnetic field generated by the induction coil 348 to the outside.

As shown in FIG. 9, the first gas supply nozzle 332, in which at least one first gas support port 330 is installed, is installed between the body to be heated 326 and the wafer 304 to supply at least a Si (silicon) atom-containing gas and a Cl (chlorine) atom-containing gas to the wafer 304. In addition, the second gas supply nozzle 336, in which at least one second gas supply port 334 is installed, is installed at a position different from the first gas supply nozzle 332 between the body to be heated 326 and the wafer 304 to supply at least a C (carbon) atom-containing gas and a reduction gas to the wafer 304. Further, similarly, the first gas exhaust port 338 is also disposed between the body to be heated 326 and the wafer 304. Furthermore, the third gas supply port 340 and the second gas exhaust port 342 are disposed between the reaction tube 344 and the insulating material 372.

In addition, while each of the first gas supply nozzle 332 and the second gas supply nozzle 336 may be provided, as shown in FIG. 11, three of the second gas supply nozzles 336 may be provided and the first gas supply nozzle 332 may be installed between the second gas supply nozzles 336. As the gas supply nozzles are alternately disposed, mixture of the Si atom-containing gas and the C atom-containing gas can be accelerated. Further, as odd numbers of the first gas supply nozzles and the second gas supply nozzles are provided, a film-forming gas can be symmetrically supplied about the second gas supply nozzles 336 to increase uniformity in the wafer 304.

The first gas supply port 330 and the first gas supply nozzle 332 are formed of, for example, carbon graphite, and installed in the reaction chamber 350. In addition, the first gas supply nozzle 332 is installed at the manifold 346 to pass through the manifold 346. Here, when the SiC epitaxial film is formed, the first gas supply port 330 is configured to supply at least a Si (silicon) atom-containing gas such as monosilane (hereinafter, referred to as $SiH_4$) gas, a Cl (chlorine) atom-containing gas such as hydrogen chloride (hereinafter, referred to as HCl) gas, and an inert gas, which is a carrier gas, such as Ar (argon) gas into the reaction chamber 350 via the first gas supply nozzle 332.

Figure 12:
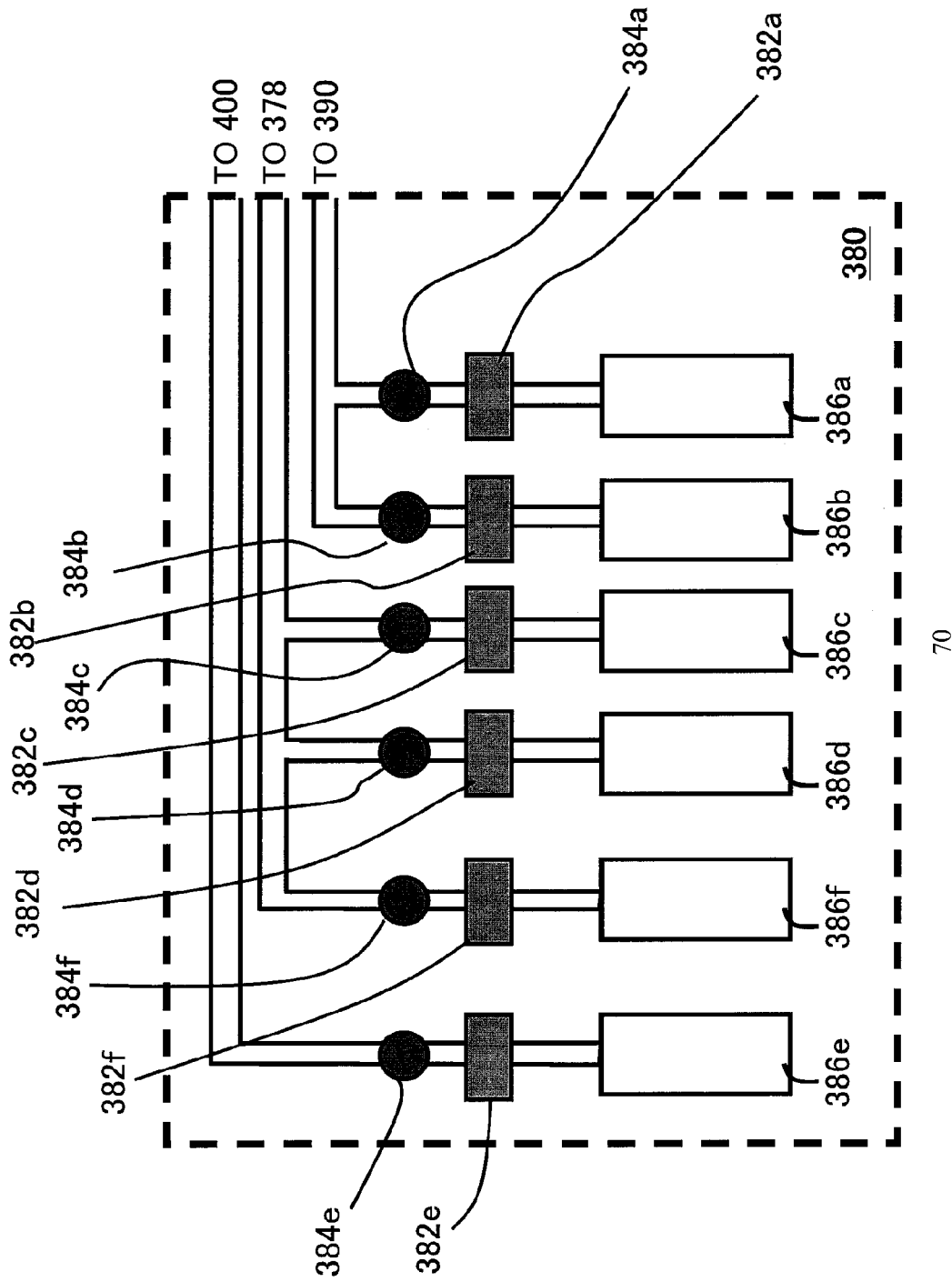
FIG. 12 is a schematic view showing an example of a gas supply unit 380 of the semiconductor manufacturing apparatus 300 in accordance with the second embodiment of the present invention.

The first gas supply nozzle 332 is connected to a gas supply unit 380 via a first gas line 378. FIG. 12 is a schematic view showing an example of the gas supply unit 380 of the semiconductor manufacturing apparatus 300 according to the second embodiment of the present invention. As shown in FIG. 12, the first gas line 378 is connected to, for example, a $SiH_4$ gas supply source 386c, a HCl gas supply source 386d, and an inert gas supply source 386f via mass flow controllers (hereinafter, referred to as MFCs) 382c, 382d and 382f, which are flow rate controllers (flow rate control units), and valves 384c, 384d and 384f to supply $SiH_4$ gas, HCl gas and an inert gas, respectively.

According to the above configuration, supply flow rates, concentrations, partial pressures, and supply timings of the SiH4 gas, HCl gas and inert gas in the reaction chamber 350 can be controlled. The valves 384c, 384d and 384f and the MFCs 382c, 382d and 382f are electrically connected to the gas flow rate control unit 388, and configured to be controlled at a predetermined timing such that the flow rates of the supplied gases reach predetermined flow rates (see FIG. 10). In addition, as a gas supply system, a first gas supply system is constituted by the gas supply sources 386c, 386d and 386f for the SiH4 gas, HCl gas and inert gas, the valves 384c, 384d and 384f, MFCs 382c, 382d and 382f, the first gas line 378, the first gas supply nozzle 332, and at least one first gas supply port 330 installed at the first gas supply nozzle 332.

The second gas supply port 334 is formed of, for example, carbon graphite, and installed in the reaction chamber 350. In addition, the second gas supply nozzle 336 is installed at the manifold 346 to pass through the manifold 346. Here, when the SiC epitaxial film is formed, the second gas supply port 334 is configured to supply at least a C (carbon) atom-containing gas such as propane (hereinafter, referred to as $C_3H_8$) gas and a reduction gas such as hydrogen (H atom monomer or $H_2$ molecule, hereinafter referred to as $H_2$) into the reaction chamber 350 via the second gas supply nozzle 336.

The second gas supply nozzle 336 is connected to the gas supply unit 380 via the second gas line 390. In addition, as shown in FIG. 12, the second gas line 390 is connected to, for example, a gas piping (not shown), and the gas piping (not shown) is connected to the $C_3H_8$ gas supply source 386a via the MFC 382a and the valve 384a, which is a flow rate control unit of a C (carbon) atom-containing gas such as $C_3H_8$ gas, and connected to a $H_2$ gas supply source 386b via the MFC 382b and the valve 384b, which is a flow rate control unit of a reduction gas such as $H_2$ gas.

According to the above configuration, supply flow rates, concentrations, and partial pressures of $C_3H_8$ gas and $H_2$ gas in the reaction chamber 350 can be controlled. The valves 384a and 384b and the MFCs 382a and 382b are electrically connected to the gas flow rate control unit 388, and configured to be controlled at a predetermined timing such that the flow rates of the supplied gases reach predetermined flow rates (see FIG. 10). Further, as a gas supply system, a second gas supply system is constituted by the gas supply sources 386a and 386b for the $C_3H_8$ gas and the $H_2$ gas, the valves 384a and 386b and the MFCs 382a and 382b of the $C_3H_8$ gas and $H_2$ gas, the second gas line 390, the second gas supply nozzle 336, and the second gas supply port 334.

In addition, in the first gas supply nozzle 332 and the second gas supply nozzle 336, each of the first gas supply port 330 and the second gas supply port 334 may be installed in an arrangement region of the substrate, and may be installed at every predetermined number of wafers 304.

As shown in FIG. 9A, the first gas exhaust port 338 is installed at a lower side than the boat 320, and the gas exhaust pipe 392 connected to the first gas exhaust port 338 is installed at the manifold 346 to pass through the manifold 346. A vacuum exhaust apparatus 396 such as a vacuum pump is connected to a downstream side of the gas exhaust pipe 392 via a pressure sensor such as a pressure detector (not shown) and a pressure regulator such as an automatic pressure controller (APC) valve 394. A pressure control unit 398 is electrically connected to the pressure sensor and the APC valve 394, and configured to adjust an opening angle of the APC valve 394 based on a pressure detected by the pressure sensor to control the pressure in the process furnace 328 to a predetermined pressure at a predetermined timing (see FIG. 10).

As described above, at least a Si (silicon) atom-containing gas and a Cl (chlorine) atom-containing gas are supplied through the first gas supply port 330, and at least a C (carbon) atom-containing gas and a reduction gas are supplied through the second gas supply port 334. Since the supplied gases flow parallel to the wafer 304 formed of Si or SiC and are exhausted through the first gas exhaust port 338, the entire wafer 304 can be efficiently and uniformly exposed to the gas.

In addition, as shown in FIG. 11, the third gas supply port 340 is disposed between the reaction tube 344 and the insulating material 372 and installed to pass through the manifold 346. Further, the second gas exhaust port 342 is disposed between the reaction tube 344 and the insulating material 372 to be opposite to the third gas supply port 340, and the second gas exhaust port 342 is connected to the gas exhaust pipe 392. The third gas supply port 340 is formed at a third gas line 400 passing through the manifold 346, and connected to the gas supply source 386e via the valve 384e and the MFC 382e. An inert gas, which is a rare gas such as Ar gas, is supplied from the gas supply source 386e, introduction of a gas contributing to growth of the SiC epitaxial film, for example, a Si (silicon) atom-containing gas, a C (carbon) atom-containing gas, a Cl (chlorine) atom-containing gas or a mixed gas thereof, between the reaction tube 344 and the insulating material 372 can be prevented, and attachment of unnecessary by-products to an inner wall of the reaction tube 344 or an outer wall of the insulating material 372 can be prevented.

Further, an inert gas supplied between the reaction tube 344 and the insulating material 372 is exhausted through the vacuum exhaust apparatus 396 via the APC valve 394 disposed at a downstream side of the gas exhaust pipe 392 in comparison with the second gas exhaust port 342.

Hereinafter, the process furnace 328 and its peripheral elements will be described.

Figure 13:
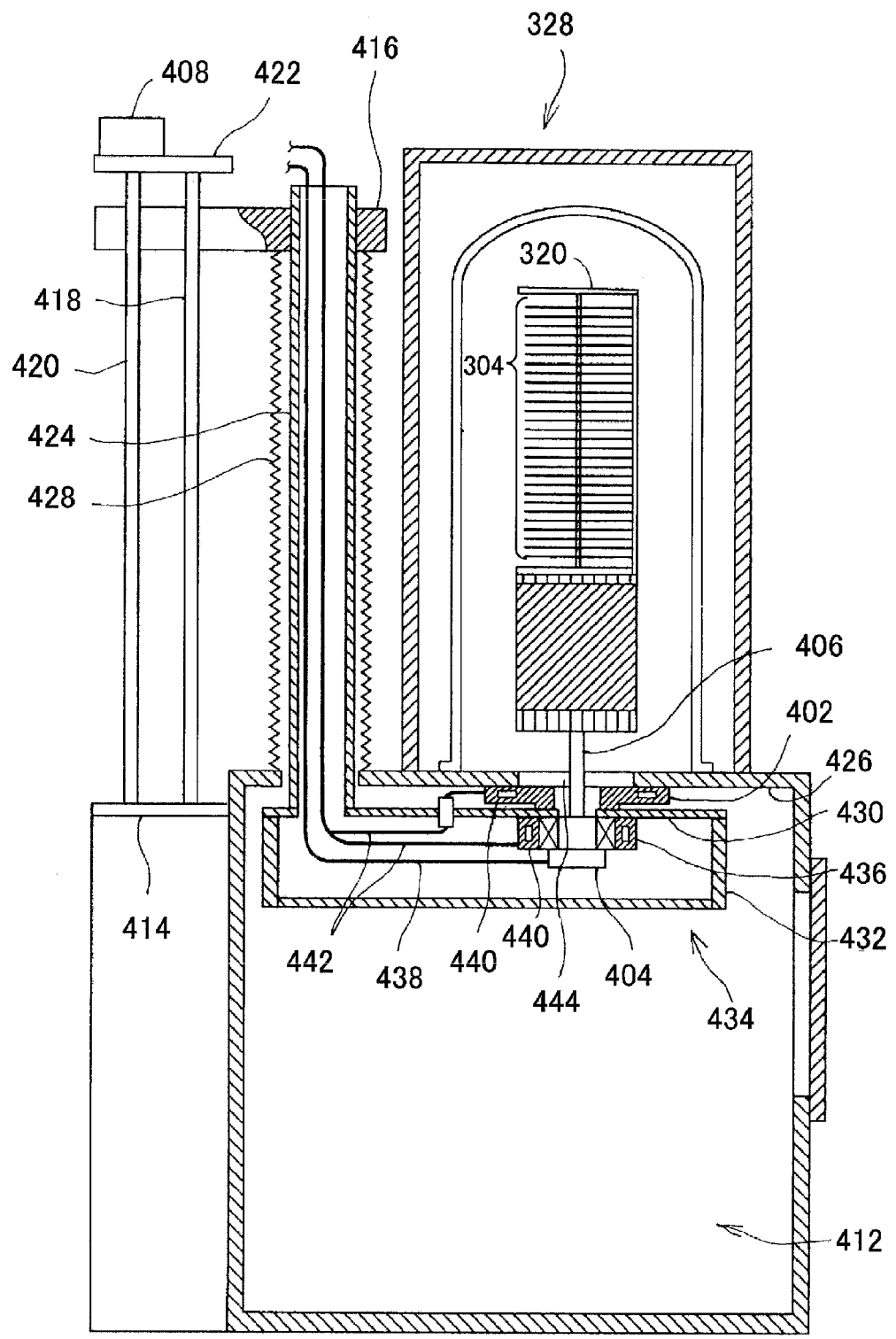
FIG. 13 is a schematic cross-sectional view of the process furnace 328 and a peripheral structure in accordance with the second embodiment of the present invention.

FIG. 13 is a schematic cross-sectional view of the process furnace 328 and its peripheral structure according to the second embodiment of the present invention. A seal cap 402, which is a furnace port cover, is installed at a lower side of the process furnace 328 to hermetically close a lower end opening of the process furnace 328. The seal cap 402 is made of a metal material such as stainless steel, and is formed in a disc shape. An O-ring (not shown), which is a seal material in contact with the lower end of the process furnace 328, is installed at an upper surface of the seal cap 402. A rotary mechanism 404 is installed at the seal cap 402, and a rotary shaft 406 of the rotary mechanism 404 passes through the seal cap 402 to be connected to the boat 320 to rotate the boat 320, thereby rotating the wafer 304.

Further, the seal cap 402 is configured to be vertically elevated by an elevation motor 408 to be described later as an elevation mechanism installed outside the process furnace 328, and thus, the boat 320 can be loaded into and unloaded from the process furnace 328. A drive control unit 410 is electrically connected to the rotary mechanism 404 and the elevation motor 408, and configured to be controlled at a predetermined timing to perform a predetermined operation (see FIG. 10).

A lower substrate 414 is installed at an outer surface of a load lock chamber 412, which is a preliminary chamber. A guide shaft 418 slidably coupled to an elevation frame 416 and a ball screw 420 threadedly engaged with the elevation frame 416 are installed at the lower substrate 414. In addition, an upper substrate 422 is installed at upper ends of the guide shaft 418 and the ball screw 420 vertically installed at the lower substrate 414. The ball screw 420 is rotated by the elevation motor 408 installed at the upper substrate 422, and the elevation frame 416 is raised by rotation of the ball screw 420.

A hollow elevation shaft 424 is vertically installed at the elevation frame 416, a connection part of the elevation frame 416 and the elevation shaft 424 is hermetically sealed, and the elevation shaft 424 is configured to be elevated with the elevation frame 416. The elevation shaft 424 passes through a top panel 426 of the load lock chamber 412, and a through-hole of the top panel 426 through which the elevation shaft 424 passes has a sufficient gap such that the elevation shaft 424 does not contact the top panel 426.

In addition, a bellows 428, which is a hollow expansion body including elasticity to cover a perimeter of the elevation shaft 424, is installed between the load lock chamber 412 and the elevation frame 416, and the load lock chamber 412 is hermetically sealed by the bellows 428. Further, the bellows 428 has sufficient elasticity to respond to an elevation amount of the elevation frame 416, and the bellows 428 has an inner diameter substantially larger than an outer diameter of the elevation shaft 424 so that the bellows 428 does not contact the elevation shaft 424 upon expansion or contraction.

An elevation substrate 430 is horizontally fixed to a lower end of the elevation shaft 424, and a drive unit cover 432 is hermetically installed at a lower surface of the elevation substrate 430 via a seal member such as an O-ring. A drive unit receiving case 434 is constituted by the elevation substrate 430 and the drive unit cover 432, and thus, an interior of the drive unit receiving case 434 is isolated from an atmosphere in the load lock chamber 412.

In addition, the rotary mechanism 404 of the boat 320 is installed in the drive unit receiving case 433, and a periphery of the rotary mechanism 404 is cooled by a cooling mechanism 436.

A power cable 438 is guided and connected to the rotary mechanism 404 through a hollow part from an upper end of the elevation shaft 424. In addition, a cooling water flow path 440 is formed at the cooling mechanism 436 and the seal cap 402. Further, the cooling water piping 442 is guided and connected to the cooling water flow path 440 through the hollow part from the upper end of the elevation shaft 424.

As the elevation motor 408 is driven to rotate the ball screw 420, the drive unit receiving case 434 is elevated via the elevation frame 416 and the elevation shaft 424.

As the drive unit receiving case 434 is raised, the seal cap 402 hermetically installed at the elevation substrate 430 closes a furnace port 444, which is an opening of the process furnace 328, so that the wafer is in a treatable state. Further, as the drive unit receiving case 434 is lowered, the boat 320 is lowered with the seal cap 402 so that the wafer 304 is in a dischargeable state.

Hereinafter, a control configuration of each element constituting the semiconductor manufacturing apparatus 300 for forming a SiC epitaxial film will be described.

In FIG. 10, an operation part and an input/output part are constituted by the temperature control unit 362, the gas flow rate control unit 388, the pressure control unit 398 and the drive control unit 410, and electrically connected to a main control unit 446 for controlling the entire semiconductor manufacturing apparatus 300. In addition, a controller 448 is constituted by the temperature control unit 362, the gas flow rate control unit 388, the pressure control unit 398, and the drive control unit 410.

Hereinafter, reasons for constituting the first gas supply system and the second gas supply system will be described.

In the semiconductor manufacturing apparatus for forming a SiC epitaxial film, a source gas constituted by at least a Si (silicon) atom-containing gas and a C (carbon) atom-containing gas is needed to be supplied into the reaction chamber 350 to form a SiC epitaxial film. In addition, as described in this embodiment, when a plurality of wafers 304 are horizontally aligned and held in multiple stages, in order to improve uniformity between the wafers, the gas supply nozzle is installed in the reaction chamber 350 such that a film-forming gas can be supplied through the gas supply port adjacent to each wafer. Accordingly, an interior of the gas supply nozzle has the same condition as the reaction chamber. At this time, when the Si atom-containing gas and the C atom-containing gas are supplied through the same gas supply nozzle, the source gases are consumed through reaction between the source gases. As a result, the source gas is insufficient at a downstream side of the reaction chamber 350, and further, accumulations such as a SiC film accumulated through reaction in the gas supply nozzle closes the gas supply nozzle to cause instability in supply of the source gas and generation of particles.

From this, in this embodiment, the Si atom-containing gas is supplied via the first gas supply nozzle 332 and the C atom-containing gas is supplied via the second gas supply nozzle 336. As described above, by supplying the Si atom-containing gas and the C atom-containing gas through different gas supply nozzles, accumulation of the SiC film in the gas supply nozzle can be prevented. Further, when adjustment of concentrations or flow velocities of the Si atom-containing gas and the C atom-containing gas is needed, appropriate carrier gases may be supplied.

Furthermore, in order to more efficiently use the Si atom-containing gas, a reduction gas such as hydrogen gas may be used. In this case, the reduction gas may be supplied via the second gas supply nozzle 336 for supplying the C atom-containing gas. Since an amount of the reduction gas is reduced by supplying the reduction gas with the C atom-containing gas and mixing the reduction gas with the Si atom-containing gas in the reaction chamber 350, decomposition of the Si atom-containing gas can be suppressed in comparison with when the film is formed, and accumulation of the Si film in the first gas supply nozzle can be suppressed. In this case, the reduction gas can be used as a carrier gas of the C atom-containing gas. Further, accumulation of the Si film can be suppressed through use of an inert gas such as Ar (in particular, a rare gas) as a carrier of the Si atom-containing gas.

In addition, a Cl atom-containing gas such as HCl may be supplied through the first gas supply nozzle 332. As a result, even when the Si atom-containing gas is decomposed by heat and is in a state accumulable in the first gas supply nozzle, an etching mode can be performed by chlorine and accumulation of the Si film into the first gas supply nozzle can be further suppressed.

Further, in the example shown in FIG. 9, while it has been described that $SiH_4$ gas and HCl gas are supplied through the first gas supply nozzle 332 and $C_3H_8$ gas and $H_2$ gas are supplied through the second gas supply nozzle 336, as described above, the examples shown in FIGS. 9 to 12 are considered as best modes, but the present invention is not limited thereto.

Furthermore, in the examples shown in FIGS. 9 to 12, while HCl gas is exemplified as a Cl atom-containing gas flowing when the SiC epitaxial film is formed, Cl gas may be used.

In addition, while the Si atom-containing gas and the Cl atom-containing gas are supplied when the SiC epitaxial film is formed, a gas containing Si atoms and Cl atoms, for example, tetrachlorosilane (hereinafter, referred to as $SiCl_4$) gas, trichlorosilane (hereinafter, referred to as $SiHCl_3$) gas, dichlorosilane (hereinafter, referred to as $SiH_2Cl_2$) gas may be supplied. Further, needless to say, the gas including Si atoms and Cl atoms may be a Si atom-containing gas, or a mixed gas of the Si atom-containing gas and the Cl atom-containing gas. In particular, since $SiCl_4$ is pyrolyzed at a relatively high temperature, it is preferable in consideration of suppression of Si consumption in the nozzle.

Furthermore, while $C_3H_8$ gas is exemplified as the C atom-containing gas, ethylene (hereinafter, referred to as $C_2H_4$) gas or acetylene (hereinafter, referred to as $C_2H_2$) gas may be used.

In addition, while $H_2$ gas is exemplified as a reduction gas, it is not limited thereto but another gas containing H atoms may be used. Further, the carrier gas may use at least one of rare gases such as Ar (argon) gas, He (helium) gas, Ne (neon) gas, Kr (krypton) gas, and Xe (xenon) gas, and a mixed gas thereof may be used.

In the above description, the Si atom-containing gas is supplied via the first gas supply nozzle 332 and the C atom-containing gas is supplied via the second gas supply nozzle 336 to suppress accumulation of the SiC film in the gas supply nozzle (hereinafter, a method of separately supplying the Si atom-containing gas and the C atom-containing gas will be referred to as a "separate method"). However, while this method can suppress accumulation of the SiC film in the gas supply nozzle, the mixture of the Si atom-containing gas and the C atom-containing gas should be sufficiently performed until the mixture arrives at the wafer 304 through the gas supply ports 330 and 334.

Therefore, in consideration of uniformity in the wafer, it is preferable for the Si atom-containing gas and the C atom-containing gas to be previously mixed to be supplied into the gas supply nozzle 332 (hereinafter, a method of supplying the Si atom-containing gas and the C atom-containing gas through the same gas supply nozzle will be referred to as a "premix method"). However, when the Si atom-containing gas and the C atom-containing gas are supplied through the same gas supply nozzle, the SiC film may be accumulated in the gas supply nozzle. Meanwhile, when a ratio (Cl/H) of chlorine as an etching gas and hydrogen as a reduction gas in the Si atom-containing gas is increased, an etching effect by chlorine is increased, and reaction with the Si atom-containing gas can be suppressed. Accordingly, as the Si atom-containing gas, the C atom-containing gas and the Cl atom-containing gas are supplied through one of the gas supply nozzles and the reduction gas (for example, hydrogen gas) used in a reduction reaction is supplied through the other gas supply nozzle, Cl/H in the gas supply nozzle is increased and accumulation of the SiC film can be suppressed.

Hereinafter, a method of manufacturing a substrate, in which a SiC film is exemplarily formed on the substrate such as the wafer 304 formed of SiC, which is one of processes of manufacturing a semiconductor device using the semiconductor manufacturing apparatus 300, will be described.

In addition, in the following description, operations of the respective elements constituting the semiconductor manufacturing apparatus 300 are controlled by the controller 448.

First, when the pod 306 in which the plurality of wafers 304 are accommodated is set on the pod stage 308, the pod conveyance apparatus 310 conveys the pod 306 from the pod stage 308 to the pod receiving shelf 312 and stocks the pod 306 thereon. Next, the pod conveyance apparatus 310 conveys the pod 306 stocked on the pod receiving shelf 312 to set the pod 306 thereon, the pod opener 314 opens the cover of the pod 306, and the substrate number detector 316 detects the number of the wafers 304 accommodated in the pod 306.

Thereafter, the substrate transfer apparatus 318 extracts the wafers 304 from the pod 306 disposed at the pod opener 314 to transfer the wafers 304 to the boat 320.

When the plurality of wafers 304 are loaded into the boat 320, the boat 320 in which the wafers 304 are held is loaded into the reaction chamber 350 by an elevation operation of the elevation frame 416 and the elevation shaft 424 by the elevation motor 408 (boat loading). In this state, the seal cap 402 seals the lower end of the manifold 346 via the O-ring (not shown).

After the boat 320 is loaded, the vacuum exhaust apparatus 396 vacuum-exhausts the reaction chamber 350 such that the interior of the reaction chamber 350 becomes a predetermined pressure (the degree of vacuum). At this time, the pressure in the reaction chamber 350 is measured by the pressure sensor (not shown), and the APC valve 394 in communication with the first gas exhaust port 338 and the second gas exhaust port 342 is feedback-controlled based on the measured pressure. In addition, the body to be heated 326 is heated such that the wafer 304 and the interior of the reaction chamber 350 reach a predetermined temperature. At this time, a conduction state to the induction coil 348 is feedback-controlled based on temperature information detected by the high-temperature radiation thermometer 356 and the low-temperature radiation thermometer 358 selected by the following switching method such that the interior of the reaction chamber 350 reaches a predetermined temperature distribution. Then, the boat 320 is rotated by the rotary mechanism 404 to rotate the wafer 304 in a circumferential direction.

Next, the Si atom-containing gas and the Cl atom-containing gas contributing to the SiC epitaxial growth reaction are supplied from the gas supply sources 386c and 386d, respectively, to be ejected into the reaction chamber 350 through the first gas supply port 330. In addition, after opening angles of the corresponding MFCs 382a and 382b are adjusted such that the C atom-containing gas and the $H_2$ gas as a reduction gas reach predetermined flow rates, the valves 384a and 384b are opened so that the gases pass through the second gas line 390 and the second gas supply nozzle 336 to be introduced into the reaction chamber 350 via the second gas supply port 334.

The gases supplied through the first gas supply port 330 and the second gas supply port 334 pass through the inside of the body to be heated 326 in the reaction chamber 350 to be exhausted through the first gas exhaust port 338 and the gas exhaust pipe 392. The gases supplied through the first gas supply port 330 and the second gas supply port 334 contact the wafer 304 formed of SiC when the gases pass through the reaction chamber 350, performing the SiC epitaxial film growth on the surface of the wafer 304.

In addition, after an opening angle of the corresponding MFC 382e is adjusted such that an inert gas, which is a rare gas such as Ar gas from the gas supply source 386e, reaches a predetermined flow rate, the valve 384e is opened, and the gas flows through the third gas line 400 to be supplied into the reaction chamber 350 through the third gas supply port 340. The inert gas, which is a rare gas such as Ar gas, supplied through the third gas supply port 340 passes between the insulating material 372 and the reaction tube 344 in the reaction chamber 350 to be exhausted through the second gas exhaust port 342.

Next, when a predetermined time elapses, the supply of the gas is stopped, and an inert gas is supplied from an inert gas supply source (not shown) so that a space inside the body to be heated 326 in the reaction chamber 350 is substituted by the inert gas and the pressure in the reaction chamber 350 is recovered to a normal pressure.

Thereafter, the seal cap 402 is lowered by the elevation motor 408 to open the lower end of the manifold 346, the processed wafer 304 held on the boat 320 is unloaded to the outside of the reaction tube 344 from the lower end of the manifold 346 (boat unloading), and the boat 320 is on standby at a predetermined position until the wafer 304 held on the boat 320 is cooled. When the wafer 304 on the boat 230 on standby is cooled to a predetermined temperature, the substrate transfer apparatus 318 extracts the wafer 304 from the boat 320 and conveys the wafer 304 to the empty pod 306 set on the pod opener 314 to receive the wafer 304 therein. Thereafter, the pod conveyance apparatus 310 conveys the pod 306 in which the wafer 304 is conveyed to the pod receiving shelf 312 or the pod stage 308. As a result, a series of operations of the semiconductor manufacturing apparatus 300 are completed.

Hereinafter, the switching of the radiation thermometer for the temperature control will be described.

For example, a threshold S is determined as a reference for determination of switching of the temperature control based on a measured value (detected temperature) by the low-temperature radiation thermometer and the temperature control based on a measured value (detected temperature) by the high-temperature radiation thermometer. When the measured value of the low-temperature radiation thermometer or the high-temperature radiation thermometer is lower than the threshold S, the temperature control based on the measured value by the low-temperature radiation thermometer is performed, and when higher than the threshold S, the temperature control based on the measured value by the high-temperature radiation thermometer is performed.

Here, for example, a detectable range of the low-temperature radiation thermometer is 50° C. to 550° C., and a detectable range of the high-temperature radiation thermometer is 450° C. to 950° C. In this case, in order to switch the control by the low-temperature radiation thermometer and the control by the high-temperature radiation thermometer, one threshold (here, for example, 500° C. at which detectable ranges of the low-temperature radiation thermometer and the high-temperature radiation thermometer overlap) is used. When the measured temperature is the threshold or lower, the control by the low-temperature radiation thermometer is performed, and when the measured temperature is the threshold or higher, the control by the high-temperature radiation thermometer is performed.

However, when the control is switched by the above method, a temperature measurement value upon the switching and a temperature measurement value around the switching temperature become unstable.

Hereinafter, the switching method of the radiation thermometer in the temperature control unit 362 will be described.

The temperature control unit 362 switches the control based on a threshold P, which is a determination reference switched from the temperature control by the low-temperature radiation thermometer 358 to the temperature control by the high-temperature radiation thermometer 356, and a threshold M switched from the temperature control by the high-temperature radiation thermometer 356 to the temperature control by the low-temperature radiation thermometer 358. Here, the threshold P is greater than the threshold M (that is, a relationship of P>M is satisfied).

In addition, provided that a upper limit of the detectable temperature range of the high-temperature radiation thermometer 356 is Max_High, a lower limit of the detectable temperature range of the high-temperature radiation thermometer 356 is Min_High, a upper limit of the detectable temperature range of the low-temperature radiation thermometer 358 is Max_Low, and a lower limit of the detectable temperature range of the low-temperature radiation thermometer 358 is Min_Low, the threshold P and the threshold M satisfy the following formula.

$$Max\_High > Max\_Low > P > M > Min\_High > Min\_Low$$

Figure 15:
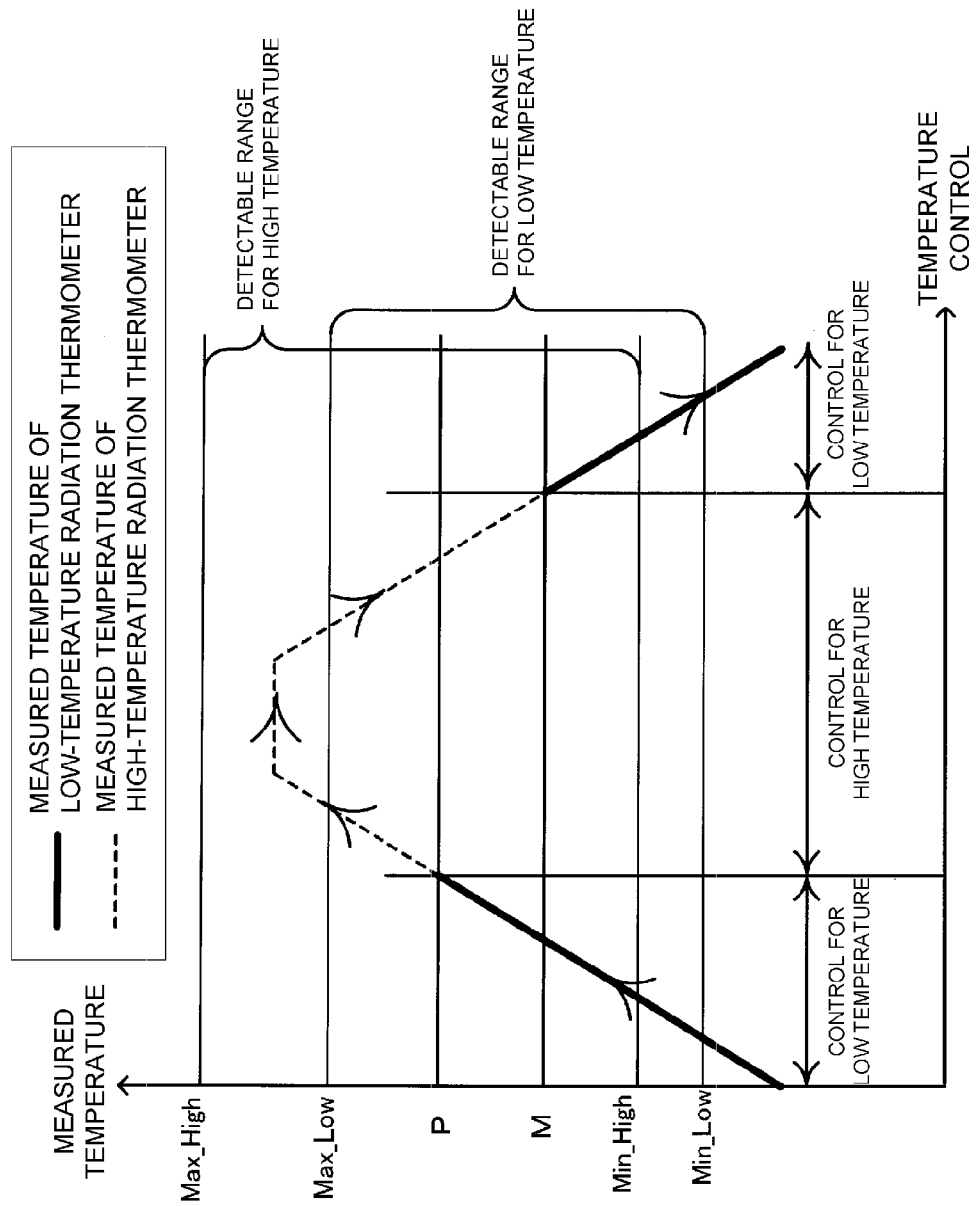
FIG. 15 is a graph showing the switching of control by a high-temperature radiation thermometer and control by a low-temperature radiation thermometer.

FIG. 14 is a table showing a switching rule of the temperature control by the temperature control unit 362. In addition, FIG. 15 is a graph showing the switching of the control by the high-temperature radiation thermometer and the control by the low-temperature radiation thermometer. In FIG. 15, a horizontal axis represents whether the temperature control by the high-temperature radiation thermometer is performed or the temperature control by the low-temperature radiation thermometer is performed, and a vertical axis represents a measurement temperature measured by the radiation thermometer. In addition, the measurement temperature shown in a thick solid line represents the measurement temperature measured by the low-temperature radiation thermometer 358, and the measurement temperature shown in a dotted line represents the measurement temperature measured by the high-temperature radiation thermometer 356.

As shown in FIGS. 14 and 15, the temperature control unit 362 performs the control switching by comparing the measurement temperature of the radiation thermometer used in the current temperature control with the threshold. When the control subject is switched from the control by the low-temperature radiation thermometer 358 to the control by the high-temperature radiation thermometer 356, the temperature control unit 362 is switched to the control by the high-temperature radiation thermometer 356 when the measurement value of the low-temperature radiation thermometer 358 is the threshold P or higher. Here, the temperature control unit 362 does not consider the measurement value of the high-temperature radiation thermometer for the switching determination when the control subject is switched from the control by the low-temperature radiation thermometer 358 to the control by the high-temperature radiation thermometer 356.

On the other hand, when the temperature control by the high-temperature radiation thermometer 356 is switched to the temperature control by the low-temperature radiation thermometer 358, the temperature control unit 362 is switched to the control by the low-temperature radiation thermometer 358 when the measurement value of the high-temperature radiation thermometer 356 is smaller than the threshold M. Similarly, the temperature control unit 362 does not consider the measurement value of the low-temperature radiation thermometer for the switching determination when the temperature control by the high-temperature radiation thermometer 356 is switched to the temperature control by the low-temperature radiation thermometer 358.

In the control switching by the temperature control unit 362, a risk of instability of the temperature measurement value upon the switching of the plurality of kinds of radiation thermometers and around the switching temperature can be improved, and temperature controllability can be improved.

Next, a variation of the second embodiment will be described. In the second embodiment, while the control switching has been performed by comparing the measurement value of the radiation thermometer used in the current temperature control with the threshold, for example, when there is a difference between the measurement value by the high-temperature radiation thermometer 356 and the measurement value by the low-temperature radiation thermometer 358 or either of the high-temperature radiation thermometer 356 and the low-temperature radiation thermometer 358 does not output a normal measurement value due to malfunction, etc., the temperature control may become unstable.

In the variation, when the temperature control by the low-temperature radiation thermometer 358 is switched to the temperature control by the high-temperature radiation thermometer 356, each of the measurement value of the low-temperature radiation thermometer 358 and the measurement value of the high-temperature radiation thermometer 356 is compared with the threshold.

The variation is distinguished from the second embodiment in that, even if the measurement value of the low-temperature radiation thermometer 358 is the threshold P or higher, when the measurement value of the variation thermometer 356 for a high temperature is smaller than the threshold M, the switching to the control by the high-temperature radiation thermometer 356 is not performed.

In the variation, the temperature control unit 362 switches the control based on the threshold P as a determination reference switched from the temperature control by the low-temperature radiation thermometer 358 to the temperature control by the high-temperature radiation thermometer 356 and the threshold M switched from the temperature control by the high-temperature radiation thermometer 356 to the temperature control by the low-temperature radiation thermometer 358. In addition, even with respect to relation between the threshold P, the threshold M, the measurable upper limit Max_High of the high-temperature radiation thermometer 356, the measurable lower limit Min_High of the high-temperature radiation thermometer 356, the measurable upper limit Max_Low of the low-temperature radiation thermometer 358, and the measurable lower limit Min_Low of the low-temperature radiation thermometer 358, the above relational expression is similarly provided.

FIG. 16 is a table showing a switching rule of the temperature control by the temperature control unit 362 in accordance with the variation.

As shown in FIG. 16, in the temperature control unit 362 of the variation, when the control subject is switched from the control by the high-temperature radiation thermometer 356 to the control by the low-temperature radiation thermometer 358, if the measurement value of the high-temperature radiation thermometer 356 is lower than the threshold M, the switching to the control by the low-temperature radiation thermometer 358 is performed.

In addition, in the temperature control unit 362 of the variation, when the temperature control by the low-temperature radiation thermometer 358 is switched to the temperature control by the high-temperature radiation thermometer 356, only when the measurement value of the low-temperature radiation thermometer 358 is the threshold P or higher and the measurement value of the high-temperature radiation thermometer 356 is the threshold M or higher, is the switching to the control by the high-temperature radiation thermometer 356 performed. That is, when the measurement value of the high-temperature radiation thermometer 356 is lower than the threshold M, even if the measurement value of the low-temperature radiation thermometer 358 is the threshold P or higher, the switching to the control by the high-temperature radiation thermometer 356 is not performed. Since the measurement value of the high-temperature radiation thermometer 356 is lower than the threshold M, in the next switching determination, the switching to the temperature control by the low-temperature radiation thermometer 358 is performed again, and the switching is continuously performed, thereby making the temperature measurement value unstable.

In addition, when the measurement value of the low-temperature radiation thermometer 358 is the threshold P or higher and the measurement value of the high-temperature radiation thermometer 356 is less than the threshold M, since any one of the high-temperature radiation thermometer 356 and the low-temperature radiation thermometer 358 may be supposed to be incorrect, in consideration of safety, the temperature control by the low-temperature radiation thermometer 358 having a high temperature measurement value is performed.

In the control switching of the variation, in addition to improvement of the risk of instability of the temperature measurement value upon the switching of the plurality of kinds of radiation thermometers and around the switching temperature, safer temperature control than the control switching shown in the second embodiment is realized.

In the description of the second embodiment and the variation thereof, while the temperature control of the temperature control unit 362 has been exemplarily performed using the radiation thermometers 356 and 358 disposed at the middle zone, the high-temperature radiation thermometer and the low-temperature radiation thermometer may be installed at the upper or lower zone to similarly perform the control switching.

In addition, the present invention is not limited to the semiconductor manufacturing apparatus for forming a SiC epitaxial film, but may be applied to the entire vertical substrate processing apparatus.

What is claimed is:

1. A substrate processing apparatus comprising:

a heater configured to heat a process chamber wherein a substrate is accommodated;

an inner tube defining the process chamber and an outer tube installed between the inner tube and the heater;

an internal temperature sensor installed between the inner tube and the outer tube and configured to detect a temperature about the substrate;

an external temperature sensor installed between the outer tube and the heater and configured to detect a temperature about the heater; and a control unit configured to control the heater by switching between a first control mode, a second control mode and a third control mode, wherein the control unit is configured to control the heater based on temperature detected by only the external temperature sensor in the first control mode, the control unit is configured to control the heater based on temperatures detected by both the internal temperature sensor and the external temperature sensor in the second mode, and the control unit is configured to control the heater using neither the internal temperature sensor nor the external temperature sensor in the third control mode, and the control unit is configured to switch from the first mode to the second mode when the temperature detected by the external temperature sensor reaches a first threshold temperature, and to switch from the second mode to the first mode when the temperature detected by the external temperature sensor reaches a second threshold temperature lower than the first threshold temperature, and wherein a heat resistance of the internal temperature sensor is greater than that of the external temperature sensor, and a temperature detection performance of the external temperature sensor is higher than that of the internal temperature sensor.

2. The substrate processing apparatus of claim 1, wherein the control unit is configured to control the heater in the second control mode based on a second signal generated based on: the temperature detected by the external temperature sensor; and a first signal generated based on the temperature detected by the internal temperature sensor and a predetermined temperature value.

3. The substrate processing apparatus of claim 1, wherein the internal temperature sensor comprises a low temperature sensor and a high temperature sensor having different detectable temperature ranges, the low temperature sensor having an upper limit of the detectable temperature range lower than an upper limit of the detectable temperature range of the high temperature sensor and higher than a lower limit of the detectable temperature range of the high temperature sensor.

4. The substrate processing apparatus of claim 3, wherein each of the low temperature sensor and the high temperature sensor comprises a radiation thermometer, and the low temperature sensor and the high temperature sensor are configured to measure temperatures of same zone.

5. The substrate processing apparatus of claim 1, wherein the internal temperature sensor disposed in an upper zone or a lower zone are for monitoring.

6. The substrate processing apparatus of claim 1, wherein the internal temperature sensor and the external temperature sensor comprise B-type thermocouple and R-type thermocouple, respectively.

* * * * *